(12) United States Patent
Yoneyama et al.

(10) Patent No.: US 10,605,433 B2
(45) Date of Patent: Mar. 31, 2020

(54) WAVELENGTH CONVERSION MEMBER, BACKLIGHT UNIT, IMAGE DISPLAY DEVICE, AND METHOD OF MANUFACTURING WAVELENGTH CONVERSION MEMBER

(71) Applicant: FUJIFILM Corporation, Tokyo (JP)

(72) Inventors: Hiroyuki Yoneyama, Kanagawa (JP);
Naoyoshi Yamada, Kanagawa (JP);
Tatsuya Oba, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 285 days.

(21) Appl. No.: 15/668,034

(22) Filed: Aug. 3, 2017

(65) Prior Publication Data

US 2017/0328541 A1 Nov. 16, 2017

Related U.S. Application Data

(63) Continuation of application No. PCT/JP2016/052734, filed on Jan. 29, 2016.

(30) Foreign Application Priority Data

Feb. 9, 2015 (JP) .................................. 2015-023286

(51) Int. Cl.
  *F21V 13/02* (2006.01)
  *G02B 5/02* (2006.01)
  (Continued)

(52) U.S. Cl.
  CPC ............ *F21V 13/02* (2013.01); *C09K 11/623* (2013.01); *C09K 11/64* (2013.01); *F21K 9/64* (2016.08);
  (Continued)

(58) Field of Classification Search
  None
  See application file for complete search history.

(56) References Cited

U.S. PATENT DOCUMENTS

2004/0183963 A1    9/2004  Nakamura et al.
2007/0212498 A1*   9/2007  Fukushige ............... C08J 3/243
                                                              428/1.31
(Continued)

FOREIGN PATENT DOCUMENTS

JP    2004-207136 A     7/2004
JP    2009-231273 A    10/2009
(Continued)

OTHER PUBLICATIONS

International Search Report issued in PCT/JP2016/052734 dated Apr. 26, 2016.
(Continued)

*Primary Examiner* — Britt D Hanley
(74) *Attorney, Agent, or Firm* — Edwards Neils LLC; Jean C. Edwards, Esq.

(57) ABSTRACT

A wavelength conversion member, is provided with a wavelength conversion layer that includes quantum dots and is interposed between two barrier layers. The wavelength conversion member includes a light scattering layer that is provided between the barrier layers and the wavelength conversion layer, in which one of the barrier layers closest to the light scattering layer is formed of an inorganic component, the light scattering layer includes a binder, which is formed of either a compound having a hydrogen bonding functional group and a polymerizable group in a molecule or an organic metal coupling agent, and scattering particles having a diameter R of 0.2 to 5 µm, a thickness d (Continued)

of the light scattering layer is 0.2 to 4 µm, a thickness D of the wavelength conversion layer is 10 to 100 µm, and a ratio of d to D is 0.2% to 10%.

17 Claims, 5 Drawing Sheets

(51) Int. Cl.
 *H01L 33/50*  (2010.01)
 *F21K 9/64*  (2016.01)
 *F21V 9/30*  (2018.01)
 *C09K 11/62*  (2006.01)
 *C09K 11/64*  (2006.01)

(52) U.S. Cl.
 CPC .............. *F21V 9/30* (2018.02); *G02B 5/0242* (2013.01); *G02B 5/0268* (2013.01); *H01L 33/501* (2013.01); *H01L 33/505* (2013.01); *G02B 5/0278* (2013.01); *H01L 2933/0091* (2013.01)

(56) References Cited

U.S. PATENT DOCUMENTS

| | | | |
|---|---|---|---|
| 2012/0113672 A1 | 5/2012 | Dubrow et al. | |
| 2014/0312339 A1 | 10/2014 | Fujita | |
| 2015/0228870 A1* | 8/2015 | Goeoetz | H01L 33/501 257/98 |
| 2016/0327690 A1 | 11/2016 | Tokinoya et al. | |

FOREIGN PATENT DOCUMENTS

| | | |
|---|---|---|
| JP | 2010-085501 A | 4/2010 |
| JP | 2013-544018 A | 12/2013 |
| JP | 5900719 B1 | 4/2016 |
| WO | 2013/073611 A1 | 5/2013 |
| WO | 2015/025950 A1 | 2/2015 |
| WO | 2015/030036 A1 | 3/2015 |

OTHER PUBLICATIONS

Written Opinion issued in PCT/JP2016/052734 dated Apr. 26, 2016.
International Preliminary Report on Patentability issued by WIPO dated Aug. 24, 2017, in connection with International Patent Application No. PCT/JP2016/052734.

* cited by examiner

WAVELENGTH CONVERSION MEMBER, BACKLIGHT UNIT, IMAGE DISPLAY DEVICE, AND METHOD OF MANUFACTURING WAVELENGTH CONVERSION MEMBER

CROSS-REFERENCE TO RELATED APPLICATIONS

This application is a Continuation of PCT International Application No. PCT/JP2016/052734, filed on Jan. 29, 2016, which was published under PCT Article 21(2) in Japanese, and which claims priority under 35 U.S.C. Section 119(a) to Japanese Patent Application No. 2015-023286 filed on Feb. 9, 2015. The above applications are hereby expressly incorporated by reference, in their entirety, into the present application.

BACKGROUND OF THE INVENTION

1. Field of the Invention

The present invention relates to a wavelength conversion member, a backlight unit, an image display device, and a method of manufacturing a wavelength conversion member.

2. Description of the Related Art

A flat panel display such as a liquid crystal display device (hereinafter also referred to as "LCD") has been more widely used as a space-saving image display device having low power consumption. A liquid crystal display device includes at least a backlight unit and a liquid crystal cell and typically further includes a member such as a backlight-side polarizing plate or a visible-side polarizing plate.

In the flat panel display market, the improvement of color reproducibility has progressed in order to improve the performance of an LCD. Regarding this point, recently, quantum dots (also referred to as QDs) have attracted attention as a light emitting material (refer to JP2013-544018A). For example, in a case where light emitted from a backlight is incident on a wavelength conversion member including quantum dots, the quantum dots are excited to emit fluorescence. Here, by using quantum dots having different light emitting properties to emit various kinds of bright light including red light, green light, and blue light, white light can be realized. Since fluorescence emitted from quantum dots has a small full width at half maximum, the obtained white light has high brightness.

JP2013-544018A discloses a display backlight unit (BLU) including: at least one primary light source that emits primary light; a light guide panel (LGP) that is optically coupled to the at least one primary light source such that the primary light is uniformly transmitted through the LGP; and a remote phosphor film including at least one population of light emitting quantum dots (QDs) and one or more primary light scattering features which scatter primary light toward the QDs. In this display backlight unit, the remote phosphor film is disposed over the LGP, the primary light is uniformly transmitted into the remote phosphor film through the LGP, and at least a portion of the primary light is absorbed by the at least one population of QDs and reemitted by the QDs as secondary light having a longer wavelength than the primary light (refer to claim 32 of JP2013-544018A).

Further, in one aspect described in JP2013-544018A, the remote phosphor film includes a QD phosphor material film that includes at least one QD phosphor material film layer including at least one matrix material, in which the at least one population of QDs are embedded in the at least one matrix material (refer to claim 42 in JP2013-544018A). In this aspect, the one or more primary light scattering features are dispersed between the QD phosphor material film and one or more barrier films (refer to claim 51 of JP2013-544018A).

On the other hand, in another aspect described in JP2013-544018A, the remote phosphor film includes a QD phosphor material film that includes at least one QD phosphor material film layer including at least one matrix material, in which the one or more primary light scattering features include scattering particles such as spherical scattering beads, and the scattering beads are embedded in the matrix material of the QD phosphor material film layer and have a refractive index higher than that of the surrounding matrix material (refer to claims 39, 53, 54, and 57 of JP2013-544018A).

SUMMARY OF THE INVENTION

However, as a result of an investigation, the present inventors found that, in the aspect described in claims 42 and 51 of JP2013-544018A in which the one or more primary light scattering features are dispersed between the QD phosphor material film and one or more barrier films, the brightness and scattering uniformity of an image display device into which the display backlight unit is incorporated are insufficient.

In addition, in the aspect described in claims 39, 53, 54, and 57 of JP2013-544018A in which the one or more primary light scattering features include scattering particles such as spherical scattering beads and in which the scattering beads are embedded in the matrix material of the QD phosphor material film layer and have a refractive index higher than that of the surrounding matrix material, the following problems were found. Brightness and scattering uniformity of an image display device into which the display backlight unit is incorporated are insufficient, the stability of a wavelength conversion layer-forming composition including quantum dots is poor, a barrier layer and a wavelength conversion layer may peel off from each other due to poor peeling resistance between the barrier layer and the wavelength conversion layer, and a decrease in brightness (brightness unevenness) in an outer peripheral region of a display surface may occur due to insufficient durability of barrier properties of the wavelength conversion layer.

An object to be achieved by the present invention is to provide a wavelength conversion member in which the stability of a wavelength conversion layer-forming composition including quantum dots, the peeling resistance between a barrier layer and a wavelength conversion layer, the durability of barrier properties of the wavelength conversion layer, and the brightness and scattering uniformity of an image display device into which the wavelength conversion member is incorporated are excellent.

The present inventors conceived a wavelength conversion member in which a wavelength conversion layer including quantum dots is interposed between two barrier layers, the wavelength conversion member comprising a light scattering layer that is provided between at least one of the harrier layers and the wavelength conversion layer, in which one of the barrier layers closest to the light scattering layer is formed of an inorganic component, the light scattering layer includes a specific binder and scattering particles having a specific diameter R, and a thickness of the light scattering layer, a thickness of the wavelength conversion layer, and a ratio of the thickness of the light scattering layer to the thickness of the wavelength conversion layer are adjusted to be in specific ranges. It was found that the above-described problems can be solved by the wavelength conversion member having the above-described configuration.

Preferable aspects of the present invention for achieving the above-described object are as follows.

[1] A wavelength conversion member in which a wavelength conversion layer including quantum dots is interposed between two barrier layers, the wavelength conversion member comprising:

a light scattering layer that is provided between at least one of the barrier layers and the wavelength conversion layer, in which one of the barrier layers closest to the light scattering layer is formed of an inorganic component, the light scattering layer includes a binder, which is formed of at least either a compound having a hydrogen bonding functional group and a polymerizable group in a molecule or an organic metal coupling agent, and scattering particles having a diameter R of 0.2 to 5 µm, a thickness d of the light scattering layer is 0.2 to 4 µm, a thickness D of the wavelength conversion layer is 10 to 100 µm, and a ratio of the thickness d of the light scattering layer to the thickness D of the wavelength conversion layer is 0.2% to 10%.

[2] In the wavelength conversion member according to [1], it is preferable that a refractive index $n_b$ of constituent elements of the light scattering layer other than the scattering particles and a refractive index $n_p$ of the scattering particles having the diameter R of 0.2 to 5 µm included in the light scattering layer satisfy the following Expression 1.

$$0.04 \leq |n_p - n_b| \leq 1.35 \qquad \text{Expression 1}$$

[3] In the wavelength conversion member according to [1] or [2], it is preferable that the refractive index $n_b$ of the constituent elements of the light scattering layer other than the scattering particles is 1.45 to 1.54, that the refractive index $n_p$ of the scattering particles having the diameter R of 0.2 to 5 µm included in the light scattering layer is 1.55 and 2.80, and that the following Expression A-1 is satisfied.

$$0.04 \leq |n_p - n_b| \leq 1.35 \qquad \text{Expression A-1}$$

[4] In the wavelength conversion member according to [3], it is preferable that the refractive index $n_b$ is 1.45 or higher and lower than 1.49, and that the following Expression A-2 is satisfied.

$$0.06 \leq |n_p - n_b| \leq 1.35 \qquad \text{Expression A-2}$$

[5] In the wavelength conversion member according to [4], it is preferable that the light scattering layer includes at least the binder and fine particles having a diameter of 110 nm or less as the constituent elements other than the scattering particles, and that a refractive index of the fine particles having a diameter of 110 nm or less is 1.48 or lower.

[6] In the wavelength conversion member according to any one of [3] to [5], it is preferable that the scattering particles having the diameter R of 0.2 to 5 µm are at least one kind of particles selected from the group consisting of inorganic oxide particles, particles which are formed of a monomer having a fluorene skeleton, and resin particles including inorganic oxide fine particles.

[7] In the wavelength conversion member according to [1] or [2], it is preferable that the refractive index $n_b$ of the constituent elements of the light scattering layer other than the scattering particles is 1.55 to 1.80, that the refractive index $n_p$ of the scattering particles having the diameter R of 0.2 to 5 µm included in the light scattering layer is 1.20 and 1.54, and that the following Expression B-1 is satisfied.

$$0.04 \leq |n_p - n_b| \leq 0.60 \qquad \text{Expression B-1}$$

[8] in the wavelength conversion member according to [7], it is preferable that the light scattering layer includes at least the binder and fine particles having a diameter of 110 nm or less as the constituent elements other than the scattering particles, and that a refractive index of the fine particles having a diameter of 110 nm or less is 1.65 or higher.

[9] In the wavelength conversion member according to [7] or [8], it is preferable that as the binder included in the light scattering layer, a binder which is formed of a monomer having a fluorene skeleton is included.

[10] In the wavelength conversion member according to any one of [7] to [9], it is preferable that the scattering particles having the diameter R of 0.2 to 5 µm are at least one kind of particles selected from the group consisting of inorganic particles, fluorine-containing compound particles, and silicone particles.

[11] In the wavelength conversion member according to any one of [2] to [10], it is preferable that the light scattering layer includes first scattering particles and second scattering particles having a larger diameter than the first scattering particles, that a diameter of the first scattering particles is 0.2 to 1 µm, that a diameter of the second scattering particles is more than 1 µm and 5 µm or less, and that the second scattering particles satisfy the following Expression 2.

$$|n_{p2} - n_b| < 0.04 \qquad \text{Expression 2}$$

In Expression 2, $n_{p2}$ represents a refractive index of the second scattering particles, and $n_b$ represents the refractive index of the constituent elements of the light scattering layer other than the scattering particles.

[12] The wavelength conversion member according to [11], it is preferable that the following Expression 3 is satisfied.

$$1.0 < R_2/d \leq 4 \qquad \text{Expression 3}$$

In Expression 3, $R_2$ represents the diameter of the second scattering particles in units of µm, and d represents the thickness of the light scattering layer in units of µm.

[13] In the wavelength conversion member according to any one of [1] to [12], it is preferable that the light scattering layer includes first scattering particles and second scattering particles having a larger diameter than the first scattering particles, that at least either the first scattering particles or the second scattering particles arc the scattering particles having the diameter R of 0.2 to 5 µm, that the second scattering particles satisfy the following Expression 3, and that the first scattering particles satisfy the following Expression 4.

$$1.0 < R_2/d \leq 4 \qquad \text{Expression 3}$$

$$0.05 \leq R_1/d \leq 1.0 \qquad \text{Expression 4}$$

In Expressions 3 and 4, $R_2$ represents the diameter of the second scattering particles in units of µm, $R_1$ represents a diameter of the first scattering particles in units of µm, and d represents the thickness of the light scattering layer in units of µm.

[14] In the wavelength conversion member according to any one of [1] to [13], it is preferable that the wavelength conversion layer includes at least green light emitting quantum dots and red light emitting quantum dots.

[15] In the wavelength conversion member according to any one of [1] to [14]], it is preferable that the wavelength conversion layer includes a binder which is formed of an alicyclic epoxy, or a monofunctional (meth)acrylate compound in which a value Mw/F obtained by dividing a molecular weight Mw by the number F of polymerizable functional groups included in one molecule is 130 or higher, one (meth)acryloyl group is present in one molecule is 1, and a Log P value is 3.0 or lower.

[16] A method of manufacturing a wavelength conversion member in which a wavelength conversion layer including quantum dots is interposed between two barrier layers, the method comprising:

a step of forming a light scattering layer by laminating a binder and a light scattering layer-forming composition on a first barrier layer formed of an inorganic component such that a thickness d of the light scattering layer is 0.2 to 4 µm, the binder being formed of at least either a compound having a hydrogen bonding functional group and a polymerizable group in a molecule or an organic metal coupling agent, and the light scattering layer-forming composition including scattering particles having a diameter R of 0.2 to 5 µm;

a step of laminating a wavelength conversion layer-forming composition including quantum dots on the light scattering layer such that a thickness D of the wavelength conversion layer is 10 to 100 µm and such that a ratio of the thickness d of the light scattering layer to the thickness D of the wavelength conversion layer is 0.2% to 10%; and a step of laminating a second barrier layer on the wavelength conversion layer.

[17] It is preferable that the method of manufacturing a wavelength conversion member according to [16], comprises a step of forming the wavelength conversion layer by applying an external stimulus to the wavelength conversion layer-forming composition interposed between the light scattering layer and the second barrier layer to cure the wavelength conversion layer-forming composition.

[18] A backlight unit comprising at least the wavelength conversion member according to any one of [1] to [15] and a light source.

[19] An image display device comprising at least the wavelength conversion member according to any one of [1] to [15] or the backlight unit according to [18].

According to the present invention, a wavelength conversion member can be provided in which the stability of a wavelength conversion layer-forming composition including quantum dots, the peeling resistance between a barrier layer and a wavelength conversion layer, the durability of barrier properties of the wavelength conversion layer, and the brightness and scattering uniformity of an image display device into which the wavelength conversion member is incorporated are excellent.

DESCRIPTION OF THE PREFERRED EMBODIMENTS

Figure 1A:
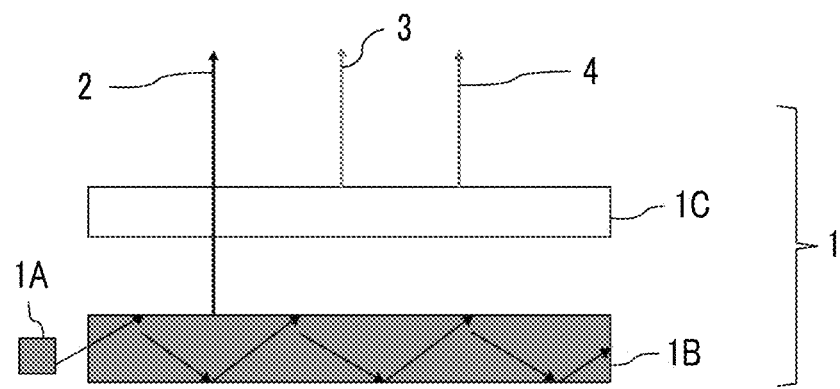
FIGS. 1A and 1B are diagrams showing a backlight unit including a wavelength conversion member.

The following description has been made based on a representative embodiment of the present invention. However, the present invention is not limited to the embodiment. In the present invention and this specification, numerical ranges represented by "to" include numerical values before and after "to" as lower limit values and upper limit values.

In addition, in the present invention and this specification, "full width at half maximum" of a peak refers to the width of the peak at ½ of the height of the peak. In addition, light having a center emission wavelength in a wavelength range of 430 to 480 nm is called blue light, light having a center emission wavelength in a wavelength range of 520 to 560 nm is called green light, and light having a center emission wavelength in a wavelength range of 600 to 680 nm is called red light.

[Wavelength Conversion Member]

In a wavelength conversion member according to the present invention, a wavelength conversion layer including quantum dots is interposed between two barrier layers, the wavelength conversion member including:

a light scattering layer that is provided between at least one of the barrier layers and the wavelength conversion layer, in which one of the barrier layers closest to the light scattering layer is formed of an inorganic component, the light scattering layer includes a binder, which is formed of at least either a compound having a hydrogen bonding functional group and a polymerizable group in a molecule or an organic metal coupling agent, and scattering particles having a diameter R of 0.2 to 5 µm, a thickness d of the light scattering layer is 0.2 to 4 µm, a thickness D of the wavelength conversion layer is 10 to 100 µm, and a ratio of the thickness d of the light scattering layer to the thickness D of the wavelength conversion layer is 0.2% to 10%.

In the wavelength conversion member according to the present invention having the above-described configuration, the stability of a wavelength conversion layer-forming composition including quantum dots, the peeling resistance between a barrier layer and a wavelength conversion layer, the durability of barrier properties of the wavelength conversion layer, and the brightness and scattering uniformity of an image display device into which the wavelength conversion member is incorporated are excellent. The reason for the excellent results is not limited to any specific theory but is presumed to be as follows. In the wavelength conversion member according to the present invention, the scattering particles and the quantum dots are disposed in different layers. Therefore, the stability of the wavelength conversion layer-forming composition including quantum dots is excellent. In the wavelength conversion member according to the present invention, the specific binder is used in the light scattering layer. Therefore, the peeling resistance between the barrier layers and the wavelength conversion layer is excellent. In the wavelength conversion member according to the present invention, the wavelength conversion layer including quantum dots is interposed between the two barrier layers, and the light scattering layer is provided between at least one of the barrier layers and the wavelength conversion layer. In addition, the thickness d of the light scattering layer in which the specific binder which improves peeling resistance but low barrier properties is used is set to be small with respect to the thickness D of the wavelength conversion layer. Therefore, the durability of barrier properties of the wavelength conversion layer is excellent, in the wavelength conversion member according to the present invention, the scattering particles having the specific particle size which can impart scattering properties are used in a layer different from that where the quantum dots are used, and thus the problem of dispersibility caused by an interaction between the quantum dots and the scattering particles can be improved. Therefore, the brightness and scattering uniformity of an image display device into which the wavelength conversion member is incorporated are excellent. The configuration capable of simultaneously exhibiting the effects of the present invention could not have been conceived by those skilled in the art based on the configuration disclosed in JP2013-544018A.

The present inventors thought that the effects of the present invention are synergistic due to the configuration of the wavelength conversion member according to the present invention. In particular, the reason why the above-described decrease in an outer peripheral region of a display surface can be improved by improving the durability of barrier properties of a wavelength conversion layer is presumed to be as follows.

Quantum dots have a problem in that the emission efficiency decreases due to a photooxidation reaction when coming into contact with oxygen. Regarding this point, JP2013-544018A discloses a configuration in which a barrier layer is laminated on a film (wavelength conversion layer) including quantum dots in order to protect the quantum dots from oxygen and the like.

On the other hand, when a wavelength conversion member is processed into a product, a wavelength conversion member having a product size is cut (for example, is punched using a punching machine) from a sheet-shaped wavelength conversion member original fabric. However, in the product which is cut as described above, a barrier layer is not present on an end surface, and thus there is a concern that the emission efficiency of quantum dots may decrease due to permeation of oxygen through the end surface. In addition, in a case where peeling occurs at an end portion of an interface between a wavelength conversion layer and a barrier layer adjacent thereto during cutting of a product, the emission efficiency of quantum dots may decrease due to permeation of oxygen through the end portion of the interface. The present inventors thought that a decrease in the emission efficiency of the quantum dots caused by the permeation of oxygen through the end surface or through an end portion of an interface with an adjacent layer may cause the above-described decrease in brightness in an outer peripheral region of a display surface.

Therefore, the present inventors found that, in order to suppress a decrease in the emission efficiency of quantum dots caused by the permeation of oxygen through the end surface or through an end portion of an interface with an adjacent layer, it is necessary that at least peeling resistance is improved to prevent peeling between a barrier layer and a wavelength conversion layer. Based on this finding, the present inventors improved peeling resistance by using the specific binder in the light scattering layer. Further, the present inventors focused on the fact that the specific binder which can improve peeling resistance has low barrier properties and found that the permeation of oxygen through an end portion of an interface can be suppressed by adopting the following configurations: a configuration in which the wavelength conversion layer including quantum dots is interposed between the two barrier layers, and the light scattering layer is provided between at least one of the barrier layers and the wavelength conversion layer; and a configuration in which the thickness d of the light scattering layer in which the specific binder which improves peeling resistance but low barrier properties is used is set to be small with respect to the thickness D of the wavelength conversion layer.

Hereinafter, the wavelength conversion member according to the present invention will be described in more detail.

<Configuration and Disposition Example of Wavelength Conversion Member>

The wavelength conversion member has a function of converting the wavelength of at least a portion of incident light to emit light having a different wavelength from that of the incident light The wavelength conversion member can be used as a component of a backlight unit of a liquid crystal display device.

Figure 1B:
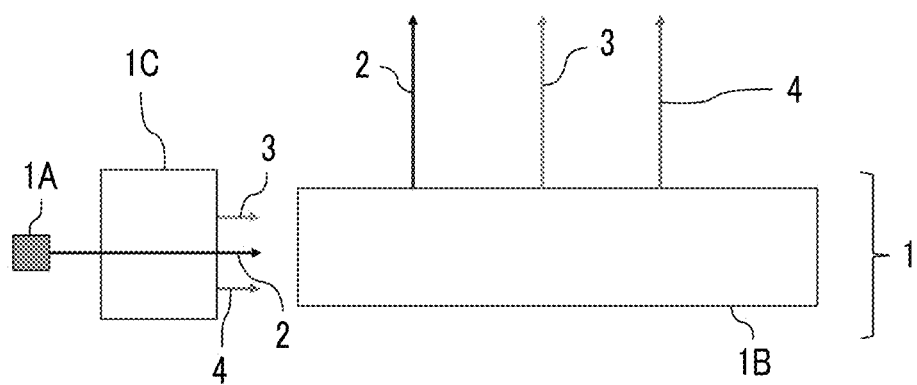

FIGS. 1A and 1B are diagrams showing a backlight unit 1 including the wavelength conversion member. In FIGS. 1A and 1B, the backlight unit 1 includes a light source 1A and a light guide plate 1B for realizing a surface light source. In an example shown in FIG. 1A, the wavelength conversion member is disposed on a path of light emitted from the light guide plate. In the example shown in FIG. 1A, the light emitted from the light guide plate 1B is incident on a wavelength conversion member 1C.

In the example shown in FIG. 1A, light 2 emitted from the light source 1A which is disposed at an edge portion of the light guide plate 1B is blue light, and is directed from a surface of the light guide plate 1B on a liquid crystal cell (not shown) side toward the liquid crystal cell. The wavelength conversion member 1C which is disposed on the path of the light (blue light 2) emitted from the light guide plate 1B includes at least: quantum dots (A) that are excited by the blue light 2 to emit red light 4; and quantum dots (B) that are excited by the blue light 2 to emit green light 3. In this way, the backlight unit 1 emits the green light 3 and the red light 4 which are excited and the blue light 2 which has passed through the wavelength conversion member 1C. The red light, the green light, and the blue light are emitted as described above such that white light can be realized.

<Wavelength Conversion Layer>

In the wavelength conversion member, the wavelength conversion layer including the quantum dots is interposed between the two barrier layers.

It is preferable that the wavelength conversion layer includes the quantum dots in a matrix. The matrix includes a polymer, and the wavelength conversion layer can be formed of a wavelength conversion layer-forming composition (quantum dot-containing polymerizable composition) including the quantum dots and a polymerizable compound. The wavelength conversion layer may be a cured layer obtained by curing the wavelength conversion layer-forming composition. The shape of the wavelength conversion layer is not particularly limited and is preferably a sheet shape.

The quantum dots are excited by the light to emit fluorescence. The wavelength conversion layer includes at least one kind of quantum dots and may include two or more kinds of quantum dots having different light emitting properties. Well-known kinds of quantum dots include quantum dots (A) having a center emission wavelength in a wavelength range of 600 nm to 680 nm, quantum dots (B) having a center emission wavelength in a wavelength range of 520 nm to 560 nm, and quantum dots (C) having a center emission wavelength in a wavelength range of 400 nm to 500 nm. The quantum dots (A) are excited by the excitation light to emit red light, the quantum dots (B) are excited by the excitation light to emit green light, and the quantum dots (C) are excited by the excitation light to emit blue light. For example, in a case where blue light is incident as excitation light on the wavelength conversion layer including the quantum dots (A) and the quantum dots (B), white light can be realized by red light emitted from the quantum dots (A), green light emitted from the quantum dots (B), and blue light having passed through the wavelength conversion member. In addition, in a case where ultraviolet light is incident as excitation light on the wavelength conversion layer including the quantum dots (A), (B), and (C), white light can be realized by red light emitted from the quantum dots (A), green light emitted from the quantum dots (B), and blue light emitted from the quantum dots (C).

In the wavelength conversion member according to the present invention, it is preferable that the wavelength conversion layer includes at least green light emitting quantum dots and red light emitting quantum dots.

(Composition of Wavelength Conversion Layer, and Composition of Wavelength Conversion Layer-Forming Composition)

It is preferable that the wavelength conversion layer is a cured layer of the wavelength conversion layer-forming composition. The wavelength conversion layer-forming composition includes the quantum dots and at least one first polymerizable compound. The wavelength conversion layer-forming composition may further include other components such as a polymerization initiator, a viscosity adjuster, or an organic metal coupling agent.

—Quantum Dots—

In addition to the above description, the details of the quantum dots can be found in, for example, paragraphs "0060" to "0066" of JP2012-169271A, but the present invention is not limited thereto. As the quantum dots, a commercially available product can be used without any particular limitation. The emission wavelength of the quantum dots can be typically adjusted by adjusting the composition of particles or the size of particles. A wavelength between the emission wavelength of the quantum dots (A), (B), and (C) can also be adjusted.

From the viewpoints of improving brightness and reducing power consumption, it is preferable that a wavelength conversion layer in a wavelength conversion member according to an aspect of the present invention emits fluorescence in which at least a part of polarizability of incident light is held. As a specific example of the optical wavelength layer which can emit the fluorescence in which at least a part of polarizability of incident light is held, quantum rod type quantum dots described in "The Physical Chemistry Letters 2013, 4, 502-507" may be used. The emission of the fluorescence in which at least a part of polarizability of incident light is held represents that, when excitation light having a polarization degree of 99.9% is incident on an optical conversion sheet, the polarization degree of fluorescence emitted from the optical conversion sheet is not 0% and is preferably 10% to 99.9% and more preferably 80% to 99.9%. The upper limit is not particularly limited. However, during an actual use, there may be a variation in manufacturing the quantum rods or an effect of eliminating polarization due to a manufacturing variation. Therefore, in practice, the polarization degree of the fluorescence emitted may be 99% or lower or 90% or lower.

The quantum dots may be added to the polymerizable composition in the form of particles or in the form of a dispersion in which they are dispersed in a solvent. It is preferable that the quantum dots are added in the form of a dispersion from the viewpoint of suppressing aggregation of particles of the quantum dots. The solvent used herein is not particularly limited. For example, 0.01 parts by mass to 10 parts by mass of the quantum dots can be added to the polymerizable composition with respect to 100 parts by mass of the total mass of the polymerizable composition.

—Binder of Wavelength Conversion Layer—

It is preferable that the wavelength conversion layer includes a binder which is formed of a monofunctional monomer.

As the monofunctional monomer, an alicyclic epoxy or a monofunctional (meth)acrylate compound is preferable from the viewpoint of the durability of barrier properties.

In the wavelength conversion member according to the present invention, it is more preferable that the wavelength conversion layer includes a binder which is formed of a monofunctional (meth)acrylate compound in which a value Mw/F obtained by dividing a molecular weight Mw by the number F of polymerizable functional groups included in one molecule is 130 or higher, one (meth)acryloyl group is present in one molecule is 1, and a Log P value is 3.0 or lower.

In the present invention and this specification, a (meth)acrylate compound or (meth)acrylate represents a compound having one or more (meth)acryloyl groups in one molecule, and a (meth)acryloyl group represents either or both of an acryloyl group and a methacryloyl group. In addition, regarding a (meth)acrylate compound, "monofunctional" represents that one (meth)acryloyl group is included in one molecule, and "polyfunctional" represents that two or more (meth)acryloyl groups are included in one molecule.

(1) As the polymerizable composition for forming the wavelength conversion layer, a monofunctional monomer is preferably used rather than a polyfunctional (meth)acrylate compound in order to suppress polymerization shrinkage from the viewpoints of improving display unevenness while preventing a local variation in the light extraction efficiency from the wavelength conversion member caused by deformation of the wavelength conversion member including the wavelength conversion layer due to polymerization shrinkage.

(2) It is considered that the compound in which Mw/F is 130 or higher is not likely to cause polymerization degree (or causes little polymerization shrinkage) even in the monofunctional monomer. From this point of view, the compound in which Mw/F is 130 or higher is preferable.

(3) It can be said that the compound having a Log P value of 3.0 or lower is a compound having higher polarity than oxygen as a nonpolar molecule, and a wavelength conversion layer which is formed of a polymerizable composition including a large amount of the above-described compound has poor compatibility with oxygen. Therefore, oxygen is not likely to permeate into the wavelength conversion layer. From this point of view, the compound having a Log P value of 3.0 or lower is preferable.

—Monofunctional (Meth)Acrylate Compound—

In the monofunctional (meth)acrylate compound, one (meth)acryloyl group is included in one molecule.

In the monofunctional (meth)acrylate compound, it is preferable that a value Mw/F obtained by dividing a molecular weight Mw by the number F of polymerizable functional groups included in one molecule is 130 or higher.

It is preferable that the monofunctional (meth)acrylate compound has a value of 3.0 or lower.

As the monofunctional (meth)acrylate compound, one compound may be used, or two or more compounds having different structures may be used.

In the monofunctional (meth)acrylate compound, it is preferable that a value Mw/F obtained by dividing a molecular weight Mw by the number F of polymerizable functional groups included in one molecule is 130 or higher. Mw/F is preferably 150 or higher. As described above, the present inventors presumed that the monofunctional (meth)acrylate compound in which Mw/F is 130 or higher is not likely to cause polymerization degree (or causes little polymerization shrinkage), Mw/F is preferably 300 or lower but may be higher than 300. In a case where Mw/F is 300 or lower, the viscosity of the polymerizable composition including the monofunctional (meth)acrylate compound tends to decrease. This point is preferable because the wavelength conversion layer is easily formed by coating. The polymerizable functional group refers to a functional group which can cause a polymerization reaction to occur by radical polymerization or cationic polymerization, and specific examples thereof include a (meth)acryloyl group, a vinyl group, a glycidyl group, an oxetane group, and an alicyclic epoxy group. Here, the alicyclic epoxy group refers to a monovalent functional group having a cyclic structure in which an epoxy ring and a saturated hydrocarbon ring are condensed. In addition, in the present invention and this specification, the polymerizable compound refers to a compound having one or more polymerizable functional groups in one molecule.

In the monofunctional (meth)acrylate compound, one (meth)acryloyl group is included in one molecule. The monofunctional (meth)acrylate compound is preferable because it is easily curable through a polymerization treatment (for example, light irradiation) and shrinkage of the matrix during curing can be suppressed. The monofunctional (meth)acrylate compound may include not only one (meth)acryloyl group hut also polymerizable functional groups other than a (meth)acryloyl group in one molecule. It is preferable that the monofunctional (meth)acrylate compound not only one (meth)acryloyl group but also the other polymerizable functional groups from the viewpoint of, for example, increasing the hardness of the wavelength conversion layer. In a case where the monofunctional (meth)acrylate compound includes polymerizable functional groups other than a (meth)acryloyl group, the number of the polymerizable functional groups in one molecule is, for example, one or more and, in a case where Mw/F is 130 or higher, may be two or more.

Here, the molecular weight of the monofunctional monomer refers to a weight average molecular weight in the case of a polymer (including an oligomer). The weight average molecular weight is a weight average molecular weight in terms of polystyrene converted from a value measured by gel permeation chromatography (GPC). As measurement conditions for GPC, for example, the following conditions can be adopted.

GPC device: HLC-8120 (manufactured by Tosoh Corporation)
Column: TSK gel Multipore HXL-M (manufactured by Tosoh Corporation, 7.8 mm ID (Inner Diameter)×30.0 cm)
Eluent: tetrahydrofuran (THF)

In addition, It is preferable that the monofunctional (meth)acrylate compound has a Log P value of 3.0 or lower. The Log P value is preferably 2.5 or lower and more preferably 2.0 or lower. The Log P value is preferably 0.5 or higher but may be lower than 0.5. It is preferable that the Log P value is 0.5 or higher because the quantum dots are more easily dispersed in the polymerizable composition including the monofunctional (meth)acrylate compound.

The Log P value is an index for hydrophilicity, in which the lower the Log P value, the higher the polarity. On the other hand, oxygen is a nonpolar molecule. The compound having a Log P value of 3.0 or lower has higher polarity than oxygen. Therefore, it is thought that, in a wavelength conversion layer which is formed of a polymerizable composition including a large amount (specifically 70 parts by mass or more with respect to 100 parts by mass of the total mass of the composition) of the above-described compound has poor compatibility with oxygen. Therefore, oxygen is not likely to permeate into the wavelength conversion layer. The present inventors presumed that this configuration contributes to suppressing the above-described decrease in the emission efficiency of quantum dots caused by permeation of oxygen through an end surface of a cut wavelength conversion layer or through an end portion of an interface with an adjacent layer.

In the present invention and this specification, the Log P value refers to a logarithm value of a partition coefficient between 1-octanol and water. The Log P value can be obtained by calculation using a fragment method, an atom approach method, or the like. The Log P value described in this specification is calculated using ChemBioDraw Ultra 12.0 (manufactured by PerkinElmer Inc.) based on a structure of a compound.

As the monofunctional monomer, one kind may be used, or two or more kinds having different structures may be used. In a case where two or more kinds are used, the content described below refers to the total content thereof. The same can be applied to the contents of other components described below.

The content of the monofunctional monomer is preferably 50 parts by mass or more, more preferably 70 parts by mass or more, and still more preferably 90 parts by mass or more with respect to 100 parts by mass of the total mass of the polymerizable compound included in the wavelength conversion layer-forming composition. In the polymerizable composition in which the content of the monofunctional monomer is in the above-described range, occurrence of the above-described display unevenness can be suppressed. As described above, the reason for this is thought to be that the polymerizable composition in which the content of the monofunctional monomer is in the above-described range is not likely to cause polymerization degree (or causes little polymerization shrinkage). For example, the content may be lower than 99 parts by mass or 95 parts by mass or lower. In addition, the total amount of polymerizable compound may be the monofunctional monomer. That is, the content may be 100 parts by mass.

In addition, the total content of all the polymerizable compounds can be adjusted to, for example, 80.00 to 99.99 parts by mass with respect to 100 parts by mass of the total mass of the polymerizable composition.

As the monofunctional (meth)acrylate compound which can be used as the monofunctional monomer, for example, acrylic acid, methacrylic acid, or a derivative thereof can be used. More specifically, a monomer having one polymerizable unsaturated bond ((meth)acryloyl group) of (meth) acrylic acid in the molecule can be used. Hereinafter, specific examples of the monofunctional (meth)acrylate monomer include the following compounds, but the present invention is not limited thereto. Specific examples include n-butyl (meth)acrylate, isobutyl (meth)acrylate, benzyl (meth)acrylate, 2-phenoxyethyl (meth)acrylate, 1,4-cyclohexanedimethanol monoacrylate, butoxyethyl (meth)acrylate, N,N-dimethylaminoethyl (meth)acrylate, cyclohexyl (meth)acrylate, 2-hydroxyethyl (meth)acrylate, 2-hydroxypropyl (meth)acrylate, 4-hydroxybutyl (meth)acrylate, and a (meth)acrylate derivative having an adamantine skeleton. The (meth)acrylic acid represents either or both acrylic acid and methacrylic acid.

—Polymerizable Compound which can be Used in Combination with Monofunctional Monomer"

As the polymerizable compound, the wavelength conversion layer-forming composition may include only one or more monofunctional monomers or may include not only one or more monofunctional monomers but also one or more other polymerizable compounds. Hereinafter, the other polymerizable compounds will also be referred to as second polymerizable compounds.

As the second polymerizable compound, one polymerizable compound or two or more polymerizable compounds having a polymerizable functional group other than a polyfunctional (meth)acrylate compound or a (meth)acryloyl group can be used. Examples of the second polymerizable compound include a polyfunctional alcohol (meth)acryloyl ester compound.

For example, the content of the second polymerizable compound is 1 part by mass or more and is preferably 40 parts by mass or less and more preferably 30 parts by mass or less with respect to 100 parts by mass of the total mass of the polymerizable compound included in the polymerizable composition.

In another aspect, for example, the content of the second polymerizable compound is 40 parts by mass to 300 parts by mass, preferably 50 parts by mass to 250 parts by mass, and more preferably 75 parts by mass to 200 parts by mass with respect to 100 parts by mass of the total mass of the polymerizable compound included in the polymerizable composition.

—Preferable Structures of Monofunctional Monomer and Second Polymerizable Compound—

It is preferable that at least either the monofunctional monomer or the second polymerizable compound is a polymerizable compound having the following structure.

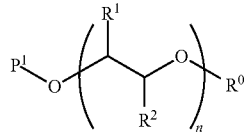
(1)

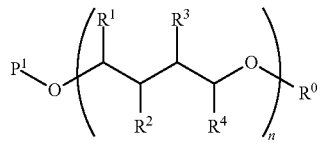
(2)

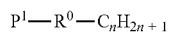
(3)

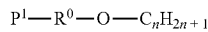
(4)

In Formulae (1) to (4), a represents an integer of 1 or more, $P^1$ represents an arbitrary structure having at least one polymerizable functional group, and $R^0$ represents a hydrogen atom or an arbitrary structure having at least one non-covalent bonding functional group. The non-covalent bonding functional group described herein refers to a functional group which can exhibit an attractive interaction other than a covalent bond. Examples of the non-covalent bonding functional group include a hydroxy group, a urethane group, a urea group, and a phenyl group. In Formula (1), at least one of $R^1$ or $R^2$ represents a hydrogen atom, and the other represents a hydrogen atom, a hydroxy group, or an alkyl group. In a case where n represents an integer of 2 or more, at least one of a plurality of $R^1$'s or a plurality of $R^2$'s represents a hydrogen atom, and the others each independently represent a hydrogen atom, a hydroxy group, or an alkyl group.

In Formula (2), at least one of $R^1$ $R^2$, $R^3$, or $R^4$ represents a hydrogen atom, and the other represents a hydrogen atom, a hydroxy group, or an alkyl group. In a case where n represents an integer of 2 or more, at least one of a plurality of $R^1$'s, a plurality of $R^2$'s, a plurality of $R^3$'s, or a plurality of $R^4$'s represents a hydrogen atom, and the others each independently represent a hydrogen atom, a hydroxy group, or an alkyl group.

A molecule of the polymerizable compound having the above-described structure tends to be more flexible than that of a polymerizable compound not having the above-described structure. The present inventors presumed that the above-described configuration contributes to improving the brittleness of the wavelength conversion layer. By improving the brittleness, fracturing or cracking of an end portion which may occur when the wavelength conversion member is cut into a product size can be suppressed. It is preferable that such fracturing or cracking can be suppressed from time viewpoint of preventing peeling between the wavelength conversion layer and a layer adjacent thereto caused by the breaking or cracking.

In addition, the present inventors thought that the polymerizable compound having the above-described structure which includes a non-covalent bonding functional group in a molecule contributes to reducing the oxygen permeability of the wavelength conversion layer.

Specific examples of the polymerizable compound having the above-described structure include 2-phenoxyethyl (methacrylate, 2-hydroxypropyl (meth)acrylate, and 4-hydroxybutyl (meth)acrylate. These examples are preferable as monofunctional monomers. Among these, 2-phenoxyethyl (meth)acrylate is preferable because it has a high effect of improving adhesiveness between the wavelength conversion layer and a layer adjacent thereto.

—Alicyclic Epoxy Compound—

In addition, in another preferable aspect of the present invention, it is preferable that a compound having one or two alicyclic epoxy groups in one molecule is used.

As the alicyclic epoxy compound, one kind may be used, or two or more kinds having different structures may be used. In the following description, in a case where two or more kinds having different structures are used as the alicyclic epoxy compound, the content of the alicyclic epoxy compound refers to the total content thereof. The same shall be applied to a case where two or more kinds having different structures are used as other components. As described above, the alicyclic epoxy compound has higher curing properties by light irradiation than an aliphatic epoxy compound. It is preferable that a polymerizable compound having excellent photocuring properties from the viewpoints of improving productivity and forming a layer in which an irradiated portion and a non-irradiated portion have uniform properties. As a result, in the wavelength conversion member, the curling of the wavelength conversion layer can be suppressed, and the quality can be made to be uniform. In general, an epoxy compound is likely to have reduced curing shrinkage during photocuring.

The alicyclic epoxy compound includes at least one alicyclic epoxy group. Here, the alicyclic epoxy group refers to a monovalent substituent having a condensed ring of an epoxy ring and a saturated hydrocarbon ring and preferably a monovalent substituent having a condensed ring of an epoxy ring and a cycloalkane ring. Preferable examples of the alicyclic epoxy compound include a compound having one or more structures shown below in one molecule, in which an epoxy ring and a cyclohexane ring are condensed.

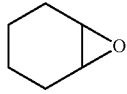

The number of the structures included in one molecule may be two or more and is preferably one or two. In addition, the structure may include one or more substituents. Examples of the substituent include an alkyl group (for example, an alkyl group having 1 to 6 carbon atoms), a hydroxyl group, an alkoxy group (for example, an alkoxy group having 1 to 6 carbon atoms), and a halogen atom (for example, a fluorine atom, a chlorine atom, a bromine atom, or an iodine atom), a cyano group, an amino group, a nitro group, an acyl group, and a carboxyl group. It is preferable that the above-described structure is unsubstituted.

In addition, the alicyclic epoxy compound may include a polymerizable functional group other than the alicyclic epoxy group. The polymerizable functional group refers to a functional group which can cause a polymerization reaction to occur by radical polymerization or cationic polymerization, and examples thereof include a (meth)acryloyl group. The content of the compound having both an alicyclic epoxy group and a (meth)acryloyl group described below can be calculated as the content of the alicyclic epoxy compound.

Preferable examples of a commercially available product of the alicyclic epoxy compound include: CELLOXIDE 2000, CELLOXIDE 2021P, CELLOXIDE 3000, CELLOXIDE 8000, CYCLOMER M100, EPOLEAD GT 301, and EPOLEAD GT 401 (all of which are manufactured by Daicel Corporation); 4-vinylcyclohexene dioxide (manufactured by Sigma-Aldrich Co., LLC.); D-limonene oxide (manufactured by Nippon Terpene Chemicals, Inc.); and SANSOCIZER E-PS (manufactured by New Japan Chemical Co., Ltd.). Among these, one kind can be used alone, or two or more kinds can be used in combination. From the viewpoint of improving adhesiveness between the wavelength conversion layer and a layer adjacent thereto, the following alicyclic epoxy compound A or B is more preferable. As a commercially available product of the alicyclic epoxy compound A, CELLOXIDE 2021P (manufactured by Daicel Corporation) can be used. As a commercially available product of the alicyclic epoxy compound B, CYCLOMER M100 (manufactured by Daicel Corporation) can be used.

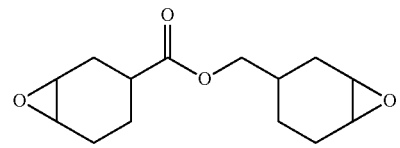

Alicyclic Epoxy Compound A

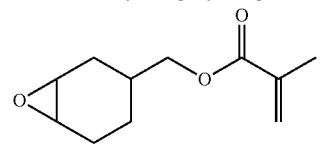

Alicyclic Epoxy Compound B

In addition, the alicyclic epoxy compound can also be synthesized using a well-known method. In addition, the alicyclic epoxy compound can be prepared without any particular limitation in the synthesis method with reference to, for example, "The Fourth Series of Experimental Chemistry, 20 Organic Synthesis II, pp. 213" (Maruzen-Yushodo Co., Ltd., 1992), "The Chemistry of Heterocyclic Compounds—Small Ring Heterocycles, Part 3 Oxiranes" (Ed. by Alfred Hasfner, John Wiley and Sons, An Interscience Publication, New York, 1985), "Adhesion, Vol. 29, No. 12, 32" (Yoshimura, 1985), "Adhesion, Vol. 30, No. 5, 42" (Yoshimura, 1986), "Adhesion, Vol. 30, No. 7, 42" (Yoshimura, 1986), JP1999-100378A (JP-H11-100378A), and JP2926262B.

—Polymerizable Compound which can be used in Combination with Alicyclic Epoxy Compound—

As the polymerizable compound, the wavelength conversion layer-forming composition may include only one or more alicyclic epoxy compounds or may include not only one or more alicyclic epoxy compounds but also one or more other polymerizable compounds. Hereinafter, the other polymerizable compounds will also be referred to as second polymerizable compounds.

As the second polymerizable compound, one polymerizable compound or two or more polymerizable compounds having a polymerizable functional group other than a polyfunctional (meth)acrylate compound or a (meth)acryloyl group can be used. Examples of the second polymerizable compound include a polyfunctional alcohol (meth)acryloyl ester compound.

For example, the content of the second polymerizable compound is 1 part by mass or more and is preferably 40 parts by mass or less and more preferably 30 parts by mass or less with respect to 100 parts by mass of the total mass of the polymerizable compound included in the polymerizable composition.

In another aspect, for example, the content of the second polymerizable compound is 40 parts by mass to 300 parts by mass, preferably 50 parts by mass to 250 parts by mass, and more preferably 75 parts by mass to 200 parts by mass with respect to 100 parts by mass of the total mass of the polymerizable compound included in the polymerizable composition.

—Viscosity Adjuster—

Optionally, the wavelength conversion layer-forming composition may include a viscosity adjuster. It is preferable that the viscosity adjuster is a filler having a particle size of 5 nm to 300 nm. In addition, it is preferable that the viscosity adjuster is a thixotropic agent. In the present invention and this specification, thixotropy refers to a property in which the viscosity of a liquid composition decreases along with an increase in shear rate, and the thixotropic agent refers to a material which has a function of imparting thixotropy to a liquid composition when added to the liquid composition. Specific examples of the thixotropic agent include fumed silica, alumina, silicon nitride, titanium dioxide, calcium carbonate, zinc oxide, talc, mica, feldspar, kaolinite (kaolin clay), pyrophyllite (pyrophyllite clay), sericite, bentonite, smectite and vermiculite (for example, montmorillonite, beidellite, nontronite, or saponite), organic bentonite, and organic smectite, In an aspect, the viscosity of the wavelength conversion layer-forming composition is preferably 3 to 100 mPa·s at a shear rate of 500 s$^{-1}$ and is preferably 300 mPa·s at a shear rate of 1 s$^{-1}$. It is preferable that a thixotropic agent is used to adjust the viscosity as described above. In addition, the reason why the viscosity of the wavelength conversion layer-forming composition is preferably 3 to 100 mPa·s at a shear rate of 500 s$^{-1}$ and is preferably 300 mPa·s at a shear rate of 1 s$^{-1}$ is as follows.

Examples of a method of manufacturing the wavelength conversion member include a manufacturing method described below including a step of applying the wavelength conversion layer-forming composition to a first substrate, adhering a second substrate to the wavelength conversion layer-forming composition, and curing the wavelength conversion layer-forming composition to form the wavelength conversion layer. In this manufacturing method, it is preferable that the wavelength conversion layer-forming composition is uniformly applied to the first substrate so as not to form coating streaks such that the thickness of the coating film is uniform. To that end, from the viewpoints of coating properties and leveling properties, it is preferable that the viscosity of the coating solution (wavelength conversion layer-forming composition) is low. On the other hand, in order to uniformly adhere the second substrate to the coating solution applied to the first substrate, it is preferable that a resistance force against a pressure during adhering is high. From this viewpoint, it is preferable that the viscosity of the coating solution is high. The shear rate of 500 s$^{-1}$ is a representative value of a shear rate applied to the coating solution which is applied to the first substrate. The shear rate of 1 s$^{-1}$ is a representative value of a shear rate applied to the coating solution immediately before adhering the second substrate to the coating solution. The shear rate of 1 s$^{-1}$ is merely a representative value. In a case where the first substrate and the second substrate are transported at the same rate when the second substrate is adhered to the coating solution applied to the first substrate, the shear rate applied to the coating solution is substantially 0 s$^{-1}$. In the actual manufacturing step, the shear rate applied to the coating solution is not limited to 1 s$^{-1}$. The shear rate of 500 s$^{-1}$ is merely a representative value. In the actual manufacturing step, the shear rate applied to the coating solution is not limited to 500 s$^{-1}$. From the viewpoint of uniform coating and adhering, it is preferable that the viscosity of the wavelength conversion layer-forming composition is 3 to 100 mPa·s at 500 s$^{-1}$ which is the representative value of the shear rate applied to the coating solution when the coating solution is applied to the first substrate and that the viscosity of the wavelength conversion layer-forming composition is 300 mPa·s or higher at 1 s$^{-1}$ which is the representative value of the shear rate applied to the coating solution immediately before adhering the second substrate to the coating solution applied to the first substrate.

—Rubber Particles—

The wavelength conversion layer-forming composition may include rubber particles. By the wavelength conversion layer-forming composition including rubber particles, the wavelength conversion layer can be prevented from being embrittled. Examples of the rubber particles include a rubber-like polymer including acrylic acid ester as a major structural monomer, a rubber-like polymer including butadiene as a major structural monomer, and an ethylene-vinyl acetate copolymer. As the rubber particle, one kind may be used alone, or two or more kinds may be used in combination. The details of the rubber particles can be found in paragraphs "0061" to "0069" of JP2014-35393A.

—Polymerization Initiator—

As the polymerization initiator, the wavelength conversion layer-forming composition may include a well-known radical polymerization initiator or a well-known cationic polymerization initiator. The details of the polymerization initiator can be found in paragraph "0037" of JP2013-043382A and paragraphs "0040" to "0042" of JP2011-159924A. The content of the polymerization initiator in the wavelength conversion layer-forming composition is preferably 0.1 mol % or higher and more preferably 0.5 mol % to 5 mol % with respect to the total mass of the polymerizable compound included in the wavelength conversion layer-forming composition. In addition, in a case where the polymerization initiator includes a volatile solvent, the content of the polymerization initiator is preferably 0.1 to 10 parts by mass, more preferably 0.2 to 8 parts by mass, and still more preferably 0.2 to 5 parts by mass with respect to 100 parts by mass of the total mass of the wavelength conversion layer-forming composition excluding the volatile solvent.

—Solvent—

Optionally, the wavelength conversion layer-forming composition may include a solvent. In this case, the kind and addition amount of the solvent used are not particularly limited. For example, as the solvent, one organic solvent or a mixture of two or more organic solvents may be used.

(Thickness of Wavelength Conversion Layer)

In the wavelength conversion member according to the present invention, the thickness D of the wavelength conversion layer is 10 to 100 μm. The thickness D of the wavelength conversion layer is preferably in a range of 10 to 100 μm, more preferably in a range of 15 to 80 μm, and still more preferably in a range of 20 to 70 μm. It is preferable that the thickness is 10 μm or more because a high wavelength conversion effect can be obtained. In addition, it is preferable that the thickness is 100 μm or less because, in a case where the wavelength conversion member is incorporated into a backlight unit, the thickness of the backlight unit can be reduced.

<Light Scattering Layer>

In the present invention, a light scattering function is imparted to the wavelength conversion member in order to efficiently extract the fluorescence, which is emitted from the quantum dots, from the wavelength conversion layer. In the present invention, as the light scattering layer, a layer having a light scattering function is provided separately from the wavelength conversion layer. The wavelength conversion member according to the present invention includes the light scattering layer that is provided between at least one of the barrier layers and the wavelength conversion layer, the light scattering layer includes a hinder, which is formed of at least either a compound having a hydrogen bonding functional group and a polymerizable group in a molecule or an organic metal coupling agent, and scattering particles having a diameter R of 0.2 to 5 μm, and the thickness d of the light scattering layer is 0.2 to 4 μm.

(Binder of Light Scattering Layer)

The light scattering layer includes a binder, which is formed of at least either a compound having a hydrogen bonding functional group and a polymerizable group in a molecule or an organic metal coupling agent.

It is preferable that the light scattering layer is formed of a light scattering layer-forming composition which includes both a compound having a hydrogen bonding functional group and a polymerizable group in a molecule and an organic metal coupling agent.

—Compound having Hydrogen Bonding Functional Group and Polymerizable Group in Molecule—

In this specification, regarding the hydrogen bonding functional group, the hydrogen bond refers to a non-covalent bond which is formed between a hydrogen atom, which forms a covalent bond with an atom having higher electronegativity than an atom in a molecule, and an atom or an atom group in the same molecule or in a different molecule through attractive interaction. The hydrogen bonding functional group refers to a functional group having the hydrogen atom which can form the above-described hydrogen bond, and specific examples thereof include a urethane group, a urea group, a phosphoric acid group (a group obtained by removing a hydroxy group from phosphoric acid; for example, a group included in a phosphate resin as caprolactone EO-modified dimethacrylate phosphate described below (trade name: KAYAMER PM21, manufactured by Nippon Kayaku Co., Ltd.), and a hydroxyl group.

Examples of the polymerizable group include a functional group selected from the group consisting of a (meth)acryloyl group, an epoxy group, and an oxetanyl group. As the compound having a hydrogen bonding functional group and a polymerizable group in a molecule, a compound having a urethane group, a phosphoric acid group, or a hydroxyl group and a polymerizable group is preferable, and a compound having a urethane group, a phosphoric acid group, or a hydroxyl group and a (meth)acryloyl group is more preferable.

—Curable Urethane—

Examples of a curable urethane such as a (meth)acrylate monomer having a urethane group include a polyfunctional urethane monomer described in JP2002-265650A, JP2002-355936A, and JP2002-067238A which is a monomer or an oligomer obtained by causing a diisocyanate, a polyol, and a hydroxyacrylate to react with each other, examples of the diisocyanate include toluene diisocyanate (TDI), diphenylmethane diisocyanate (MDI), hexamethylene diisocyanate isophorone diisocyanate (IPDI), and hexamethylene diisocyanate (HMDI), examples of the polyol include poly(propylene oxide)diol, poly(tetramethylene oxide)diol, ethoxylated bisphenol A, ethoxylated bisphenol S spiroglycol, caprolactone-modified diol, and carbonate diol, and examples of the hydroxyacrylate include 2-hydroxyethyl (meth)acrylate, 2-hydroxypropyl (meth)acrylate, glycidol di(meth)acrylate, and pentaerythritol triacrylate. Specific examples of the curable urethane include an adduct of TDI and hydroxyethyl acrylate, an adduct of IPDI and hydroxyethyl acrylate, an adduct of HDI and pentaerythritol triacrylate (PETA), a compound obtained by causing residual isocyanate which remains after preparation of an adduct of TDI and PETA to react with dodecyloxyhydroxypropyl acrylate, an adduct of nylon 6,6 and TDI, and an adduct of pentaerythritol, TDI, and hydroxyethyl acrylate. However, the curable urethane is not limited to these examples.

Examples of a commercially available product which is preferably used as the (meth)acrylate monomer having a urethane group include: AH-600, AT-600, UA-306H, UA-306T, UA-306I, UA-510H, UF-8001G, and DAUA-167 (all of which are manufactured by Kyoeisha Chemical Co., Ltd.); UA-160TM (manufactured by Shin-Nakamura Chemical Co., Ltd.); and UV-4108F and UV-4117F (both of which are manufactured by Osaka Organic Chemical industry Ltd.). Among these, one kind can be used alone, or two or more kinds can be used in combination.

—Polymerizable Compound having Phosphoric Acid Group—

Examples of the polymerizable compound having a phosphoric acid group include a monomer pendanted with a polymerizable group as a residue of phosphate.

As the polymerizable compound having a phosphate group, polymerizable compounds represented by Formulae (1) to (4) of JP2007-290369A can be preferably used.

Among the polymerizable compounds represented by Formula (1) described in JP2007-290369A, one kind may be used alone, or a combination of two or more kinds may be used. In addition, in a case where a combination of two or more kinds is used, a combination of two or more kinds selected from a monofunctional polymerizable compound represented by Formula (2) of JP2007-290369A, a bifunctional polymerizable compound represented by Formula (3) of JP2007-290369A, and a trifunctional polymerizable compound represented by Formula (4) of JP2007-290369A may be used.

As the polymerizable compound having a phosphate group, a commercially available compound such as KAYAMER series (manufactured by Nippon Kayaku Co., Ltd.) or PHOSMER series (manufactured by Uni-Chemical Co., Ltd.) may be used as it is, or a newly synthesized compound may be used.

Hereinafter, specific examples of the polymerizable compound having a phosphate group will be shown, but the monomer which can be used in the present invention is not limited thereto.

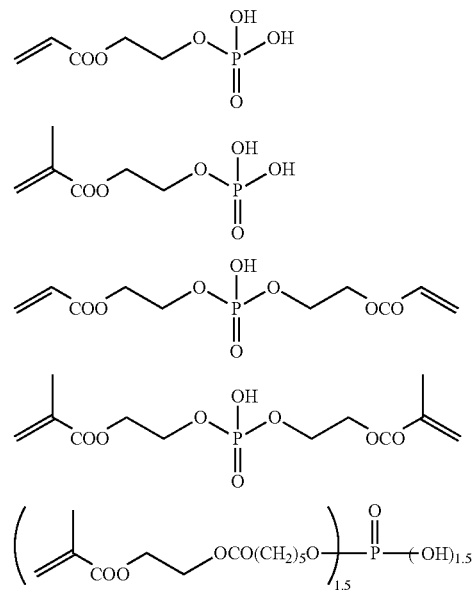

-continued

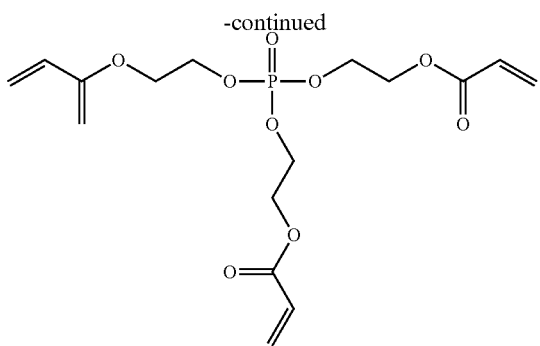

From the viewpoint of further improving adhesiveness between the light scattering layer and the inorganic layer, the content of the polymerizable compound having a phosphoric acid group in the polymerizable composition for forming the light scattering layer is preferably 1 mass % to 50 mass %, more preferably 3 mass % to 30 mass %, and still more preferably 5 mass % to 25 mass %.

—Polymerizable Compound having Hydroxyl Group—

Examples of the polymerizable compound having a hydroxyl group such as a (meth)acrylate monomer having a hydroxyl group include compounds synthesized by a reaction of a compound having an epoxy group and (meth)acrylic acid. Representatively, these compounds can be classified into a bisphenol A type, a bisphenol S type, a bisphenol F type, an epoxidized oil type, a phenol novolac type, and an alicyclic type in terms of the compound having an epoxy group. Specific examples include a meth)acrylate obtained by causing an adduct of bisphenol A and epichlorohydrin to react with (meth)acrylic acid, a (meth)acrylate obtained by causing phenol novolac to react with epichlorohydrin and further causing the obtained reaction product to react with (meth)acrylic acid, a (meth)acrylate obtained by causing an adduct of bisphenol S and epichlorohydrin to react with (meth)acrylic acid, and a (meth)acrylate obtained by causing epoxidized soybean oil to react with (meth)acrylic acid. In addition, as the (meth)acrylate monomer having a hydroxyl group, for example, a (meth)acrylate monomer having a carboxy group or a phosphoric acid group at a terminal can also be used, but the present invention is not limited thereto.

Examples of a commercially available product which can be preferably used as the polymerizable compound having a hydroxyl group include: epoxy esters M-600A, 40EM, 70PA, 200PA, 80MFA, 3002M, 3002A, 3000MK, and 3000A (all of which are manufactured by Kyoeisha Chemical Co., Ltd.); 4-hydroxybutyl acrylate (manufactured by Nippon Kasei Chemical Co., Ltd.); a monofunctional acrylate A-SA and a monofunctional methacrylate SA (manufactured by Shin-Nakamura Chemical Co., Ltd.); a monofunctional acrylate β-carboxyethyl acrylate (manufactured by Daicel-Allnex Ltd.); and JPA-514 (manufactured by Johoku Chemical Co., Ltd.). Among these, one kind can be used alone, or two or more kinds can be used in combination.

—Organic Metal Coupling Agent—

It is preferable that the light scattering layer includes a binder which is formed of an organic metal coupling agent such as a silane coupling agent. As the organic metal coupling agent, a silane coupling agent or an aluminum coupling agent is preferable, and a silane coupling agent is more preferable.

The light scattering layer-forming composition may include the organic metal coupling agent in order to improve adhesiveness with an adjacent layer. The organic metal coupling agent refers to an organic compound including a metal atom such as Si, Ti, Zr, Al, or Sn and having both a hydrolyzable group and a reactive functional group. Examples of the hydrolyzable group include an alkoxy group (RO—) and an alkylcarbonyloxy group (RCOO—). Examples of the reactive functional group include an epoxy group such as an alicyclic epoxy group, a (meth)acryloyl group, an amino group, a vinyl group, and a mercapto group. In the above description, R represents an alkyl group. The organic metal coupling agent is effective because it has an effect of promoting a thermal curing reaction. As the organic metal coupling agent, various coupling agents such as a silane coupling agent, a titanium coupling agent, a zirconium coupling agent, an aluminum coupling agent, or a tin coupling agent can be used. It is more preferable that the layer adjacent to the light scattering layer is a layer formed of an inorganic material such as a metal, a metal oxide, or a metal nitride or is a layer including the above inorganic material in a resin because the organic metal coupling agent exhibits a higher adhesion improving effect.

Examples of the silane coupling agent which can be added to the photocurable composition include vinyltrichlorosilane, vinyl trimethoxysilane, vinyltriethoxysilane, 2-(3,4-epoxycyclohexyl)ethyltrimethoxysilane, 3-glycidoxypropyltrimethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine and a partial hydrolysate, 3-trimethoxysilyl-N-(1,3-dimethyl-butylidene)propylamine and a partial hydrolysate, N-phenyl-3-aminopropyltrimethoxysilane, 3-mercaptopropylmethyldimethoxysilane, 3-mercaptopropyltrimethoxysilane, and 3-isocyanatepropyltriethoxysilane. Among these, a vinyl-, epoxy-, (meth)acryloyloxy-, amino-, or isocyanate-modified silane coupling agent is preferable, and a (meth)acryloyloxy-modified silane coupling agent is more preferable. Among these, one kind can be used alone, or two or more kinds can be used in combination.

As a commercially available product of the silane coupling agent, for example, products manufactured by Shin-Etsu Chemical Co., Ltd. can be preferably used. Examples of the products manufactured by Shin-Etsu Chemical Co., Ltd. include KBM-502, KBM-503, KBM-5103, KBE-502, KBE-503, KBM-903, and KBM-9103.

In addition, as the silane coupling agent, a silane coupling agent represented by Formula (1) described in JP2013-43382A can also be used. The details can be found in paragraphs "0011" to "0016" of JP2013-43382A.

From the viewpoint of further improving adhesiveness between the light scattering layer and the layer adjacent thereto, the content of the organic metal coupling agent in the photocurable composition is preferably 0.1 to 20 parts by mass, more preferably 0.5 to 10 parts by mass, and still more preferably 1 to 5 parts by mass with respect to 100 parts by mass obtained by subtracting the mass of the solvent from the total mass of the photocurable composition.

—Other Binders—

As the binder of the light scattering layer, another binder may be used in combination with the compound having a hydrogen bonding functional group and a polymerizable group in a molecule and the organic metal coupling agent. Examples of the other binder of the light scattering layer include a binder which is formed of one or more compound selected from the group consisting of a bifunctional or higher (meth)acrylate monomer, a monomer having two or more functional groups selected from the group consisting of an epoxy group and an oxetanyl group, a monofunctional monomer, and other monomers.

Monomers described in this specification refers to polymerizable compounds including not only monomers but also polymers having two or more repeating units which are the same or different.

Preferable examples of a bifunctional (meth)acrylate monomer among the bifunctional or higher (meth)acrylate monomers include neopentyl glycol di(meth)acrylate, 1,9-nonanediol di(meth)acrylate, tripropylene glycol di(meth)acrylate, ethylene glycol di(meth)acrylate, tetraethylene glycol di(meth)acrylate, hydroxypivalic acid neopentyl glycol di(meth)acrylate, polyethylene glycol di(meth)acrylate, dicyclopentenyl (meth)acrylate, dicyclopentenyloxyethyl (meth)acrylate, and dicyclopentanyl di(meth)acrylate.

In addition, preferable examples of a trifunctional or higher (meth)acrylate monomer among the bifunctional or higher (meth)acrylate monomers include ECH-modified glycerol tri(meth)acrylate; EO-modified glycerol tri(meth)acrylate, PO-modified glycerol tri(meth)acrylate, pentaerythritol triacrylate, pentaerythritol tetraacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl)isocyanurate, dipentaerythritol hexa(meth)acrylate, dipentaerythritol penta(meth)acrylate, caprolactone-modified dipentaerythritol hexa(meth)acrylate, dipentaerythritol hydroxy enta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy tetra(meth)acrylate, and pentaerythritol tetra(meth)acrylate.

As the other binder of the light scattering layer, a hinder which is formed of a (meth)acrylate monomer in which a ratio Mw/F obtained by dividing a molecular weight Mw by the number F of (meth)acryloyl groups included in one molecule is 200 or lower may be used. Mw/F is preferably 150 or lower and more preferably 100 or lower. By using a (meth)acrylate monomer in which Mw/F is low, the cross-linking density of the polymer in the light scattering layer formed by curing the light scattering layer-forming composition can be increased, and thus fracturing of the wavelength conversion layer can be prevented. In addition, by using a (meth)acrylate monomer in which Mw/F is low, the oxygen permeability of the light scattering layer can be reduced, and the amount of oxygen permeating into the quantum dot-containing layer through the light scattering layer can be reduced, which is preferable. Specific examples of the (meth)acrylate monomer in which Mw/F is 200 or lower include pentaerythritol triacrylate, pentaerythritol tetraacrylate, trimethylolpropane trimethacrylate, dipentaerythritol hexaacrylate, and tricyclodecane dimethanol diacrylate.

Examples of the monomer having two or more functional groups selected from the group consisting of an epoxy group and an oxetanyl group which can be preferably used in the present invention include: an aliphatic cyclic epoxy compound, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol. S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane diglycidyl ether, polyethylene glycol diglycidyl ether, and polypropylene glycol diglycidyl ether; polyglycidyl ethers of polyether polyols obtained by adding one alkylene oxide or two or more alkylene oxides to an aliphatic polyol such as ethylene glycol, propylene glycol, or glycerin; diglycidyl esters of aliphatic long-chain dibasic acids; glycidyl esters of higher fatty acids; and compounds including epoxy cycloalkane.

Examples of a commercially available product of the monomer having two or more functional groups selected from the group consisting of an epoxy group and an oxetanyl group include: CELLOXIDE 2021P and CELLOXIDE 8000 (both of which are manufactured by Daicel Corporation); and 4-vinylcyclohexene dioxide (manufactured by Sigma-Aldrich Co., LLC.). Among these, one kind can be used alone, or two or more kinds can be used in combination.

In addition, the monomer having two or more functional groups selected from the group consisting of an epoxy group and an oxetanyl group can be prepared without any particular limitation in the preparation method with reference to, for example, "The Fourth Series of Experimental Chemistry, 20 Organic Synthesis II, pp. 213" (Maruzen-Yushodo Co., Ltd., 1992), "The Chemistry of Heterocyclic Compounds—Small Ring Heterocycles, Part 3 Oxiranes" (Ed. by Alfred Hasfner, John Wiley and Sons, An Interscience Publication, New York, 1985), "Adhesion, Vol. 29, No. 12, 32" (Yoshimura, 1985), "Adhesion, Vol. 30, No. 5, 42" (Yoshimura, 1986), "Adhesion, Vol. 30, No. 7, 42" (Yoshimura, 1986), JP1999-100378A (JP-H11-100378A), JP2906245B, and JP2926262B.

As the other binder of the light scattering layer, a binder which is formed of a monofunctional (meth)acrylate monomer may also be used. As the monofunctional (meth)acrylate monomer, for example, acrylic acid, methacrylic acid, or a derivative thereof can be used. More specifically, a monomer having one polymerizable unsaturated bond ((meth)acryloyl group) of (meth)acrylic acid in the molecule can be used. Hereinafter, specific examples of the monofunctional (meth)acrylate monomer include the following compounds, but the present invention is not limited thereto.

Examples include: an alkyl (meth)acrylate with an alkyl group having 1 to 30 carbon atoms such as methyl (meth)acrylate, n-butyl (meth)acrylate, isobutyl (meth)acrylate, 2-ethylhexyl (meth)acrylate, isononyl (meth)acrylate, n-octyl (meth)acrylate, lauryl (meth)acrylate, or stearyl (meth)acrylate; an aralkyl (meth)acrylate with an alkyl group having 7 to 20 carbon atoms such as benzyl (meth)acrylate; an alkoxyalkyl (meth)acrylate with an alkoxyalkyl group having 2 to 30 carbon atoms such as butoxyethyl (meth)acrylate; an aminoalkyl (meth)acrylate with a (monoalkyl or dialkyl)aminoalkyl group having 1 to 20 carbon atoms in total such as N,N-dimethylaminoethyl (meth)acrylate; a polyalkylene glycol alkyl ether (meth)acrylate with an alkylene chain having 1 to 10 carbon atoms and a terminal alkyl ether having 1 to 10 carbon atoms such as diethylene glycol ethyl ether (meth)acrylate, triethylene glycol butyl ether (meth)acrylate, tetraethylene glycol monomethyl ether (meth)acrylate, hexaethylene glycol monomethyl ether (meth)acrylate, octaethylene glycol monomethyl ether (meth)acrylate, nonaethylene glycol monomethyl ether (meth)acrylate, dipropylene glycol monomethyl ether (meth)acrylate, heptapropylene glycol monomethyl ether (meth)acrylate, or tetraethylene glycol monoethyl ether (meth)acrylate; a polyalkylene glycol aryl ether (meth)acrylate with an alkylene chain having 1 to 30 carbon atoms and a terminal aryl ether having 6 to 20 carbon atoms such as hexaethylene glycol phenyl ether (meth)acrylate; a (meth)acrylate having an alicyclic structure and having 4 to 30 carbon atoms in total such as cyclohexyl (meth)acrylate, dicyclopentanyl (meth)acrylate, isobornyl (meth)acrylate, or a methylene oxide adduct of cyclodecatriene (meth)acrylate; a fluorinated alkyl(meth)acrylate having 4 to 30 carbon atoms in total such as heptadecafluorodecyl (meth)acrylate; a (meth)acrylate having a hydroxyl group such as 2-hydroxyethyl (meth)acrylate, 3-hydroxypropyl (meth)acrylate, 4-hydroxybutyl (meth)acrylate, triethylene glycol mono (meth)acrylate, tetraethylene glycol mono(meth)acrylate, hexaethylene glycol mono(meth)acrylate, octapropylene glycol mono(meth)acrylate, or glycerol mono(meth)acrylate or di(meth)acrylate; a (meth)acrylate having a glycidyl group such as glycidyl (meth)acrylate; a polyethylene glycol mono(meth)acrylate with an alkylene chain having 1 to 30 carbon atoms such as tetraethylene glycol mono(meth)acrylate, hexaethylene glycol mono(meth)acrylate, or octapropylene glycol mono(meth)acrylate; and a (meth)acrylamide such as (meth)acrylamide, N,N-dimethyl (meth)acrylamide, N-isopropyl (meth)acrylamide, 2-hydroxyethyl (meth)acrylamide, or acryloylmorpholine.

The content of the monofunctional (meth)acrylate monomer is preferably 1 to 300 parts by mass and more preferably 50 to 150 parts by mass with respect to 100 parts by mass of the total mass of the first polymerizable compound and the second polymerizable compound.

The light scattering layer-forming composition may include a compound which has a long-chain alkyl group having 4 to 30 carbon atoms. Specifically, it is preferable that at least arty polymerizable compound of the light scattering layer-forming composition includes a long-chain alkyl group having 4 to 30 carbon atoms. In addition, it is more preferable that the long-chain alkyl group is a long-chain alkyl group having 12 to 22 carbon atoms. The reason for this is that the dispersibility of the quantum dots is improved. As the dispersibility of the quantum dots is improved, the amount of light directed from the optical conversion layer to an exit surface increases, which is efficient for improving front brightness and front contrast.

Specifically, as the monofunctional (meth)acrylate monomer which has a long-chain alkyl group having 4 to 30 carbon atoms, for example, butyl (meth)acrylate, octyl (meth)acrylate, lauryl (meth)acrylate, oleyl (meth)acrylate, stearyl (meth)acrylate, behenyl (meth)acrylate, butyl (meth) acrylamide, octyl (meth)acrylamide, lauryl (meth)acrylamide, oleyl (meth)acrylamide, stearyl (meth)acrylamide, or behenyl (meth)acrylamide is preferable. Among these, lauryl (meth)acrylate, oleyl (meth)acrylate, or stearyl (meth)acrylate is more preferable.

The light scattering layer-forming composition may include a compound having a fluorine atom such as trifluoroethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth) acrylate, octafluoropentyl (meth)acrylate, perfluorooctylethyl (meth)acrylate, or tetrafluoropropyl (meth)acrylate. By including the above-described compound, the coating properties of the light scattering layer-forming composition can be improved.

In addition, the total amount of the polymerizable compound (monomer) in the light scattering layer-forming composition is preferably 40 to 99 parts by mass, more preferably 50 to 98 parts by mass, and still more preferably 60 to 95 parts by mass with respect to 100 parts by mass of the total mass of the light scattering layer-forming composition.

(Scattering Particles)

Regarding light scattering of the light scattering layer according to the present invention, the following two modes of light scattering can be used. One aspect is a method of using light scattering at particle interfaces based on a difference in refractive index between the scattering particles of the light scattering layer and media around the scattering particles. Another aspect is a method of using light scattering generated by unevenness being imparted to an interface between the light scattering layer and the wavelength conversion layer.

Hereinafter, the scattering particles having a diameter R of 0.2 to 5 μm which can be used in the light scattering layer according to the present invention will be described.

In one aspect according to the present invention, light scattering at particle interfaces is used based on a difference in refractive index between the scattering particles of the light scattering layer and media (constituent elements other than the scattering particles) around the scattering particles. Therefore, it is preferable that a refractive index $n_b$ of constituent elements of the light scattering layer other than the scattering particles and a refractive index $n_p$ of the scattering particles having the diameter R of 0.2 to 5 μm included in the light scattering layer satisfy the following Expression 1, $$0.04 \leq |n_p - n_b| \leq 1.35. \qquad \text{Expression 1}$$

In this specification, the refractive index $n_p$ of the scattering particles having the diameter R of 0.2 to 5 μm, a refractive index of first scattering particles described below, a refractive index $n_{p2}$ of second scattering particles described below, and a refractive index of fine particles described below having a diameter of 110 nm or less can be measured using the following method. The same amount of particles are dispersed in a mixed solvent of two different solvents while changing the refractive index thereof by changing a mixing ratio between the two different solvents, and then the turbidity is measured. When the turbidity is minimum, the refractive index of the solvent is measured using an Abbe refractometer.

In this specification, the refractive index $n_b$ of the constituent elements other than the scattering particles can be measured using the following method. The refractive index $n_b$ can be measured directly using an Abbe refractometer, or can be determined by measuring a spectral reflection spectrum of the coating film, spectroscopic ellipsometry, or the like.

The refractive index $n_b$ of the constituent elements of the light scattering layer other than the scattering particles refers to the refractive index of the media constituting the light scattering layer which are present around the scattering particles and have substantially one refractive index on average. Specifically, it is preferable that the refractive index $n_b$ of the constituent elements of the light scattering layer other than the scattering particles is a refractive index of a mixture including the binder of the light scattering layer and fine particles having a diameter of 110 nm or less which can be used in combination with the binder of the light scattering layer. A mixture including a plural kinds of binders or a mixture including the binder and fine particles having the above-described particle size range acts like the media whose constituent elements have substantially one refractive index on average. A preferable range of the refractive index $n_b$ of the constituent elements of the light scattering layer other than the scattering particles will be described below in "Design of Refractive Index of Light Scattering Layer".

Regarding the scattering particles having the diameter R of 0.2 to 5 μm, the diameter R is preferably 0.25 to 2 μm and more preferably 0.25 to 1.5 μm.

The particle sizes of the scattering particles, first scattering particles described below, second scattering particles described below, and the fine particles having a diameter of 110 nm or less can be measured with a well-known method using a Coulter counter, an electron microscope image, or the like. In this specification, values measured using the following method are used.

The wavelength conversion member is cut into a specimen having a thickness of 50 nm using a microtome, and an image of a cross-section thereof is obtained using a scanning electron microscope. This image is output with a magnification of 5000 to 50000 times, the apparent average particle sizes of 20 particles are measured, and the average value is obtained as the diameter of the particles.

Preferable kinds, preferable configurations, and preferable refractive indices of the scattering particles having the diameter R of 0.2 to 5 μm in aspects of a design A and a design B of the refractive index of the light scattering layer will be described below, respectively.

(Design of Refractive Index of Light Scattering Layer)
—Aspect of Design A of Refractive Index—

In the wavelength conversion member according to the present invention, it is preferable that the refractive index $n_b$ of the constituent elements of the light scattering layer other than the scattering particles is 1.45 to 1.54, that the refractive index $n_p$ of the scattering particles having the diameter R of 0.2 to 5 μm included in the light scattering layer is 1.55 and 2.80, and that the following Expression A-1 is satisfied.

$$0.04 \leq |n_p - n_b| \leq 1.35 \quad \text{Expression A-1}$$

In the light scattering layer according to the aspect of the design A of the refractive index, it is preferable that $n_b$ is 1.45 or higher and lower than 1.49 and that the following Expression A-2 is further satisfied.

$$0.06 \leq \Delta n = n_p - n_b \leq 1.14 \quad \text{Expression A-2}$$

In the aspect of the design A of the refractive index, it is preferable that the light scattering layer includes at least the binder and fine particles having a diameter of 110 nm or less as the constituent elements other than the scattering particles, and that a refractive index of the fine particles having a diameter of 110 nm or less is 1.48 or lower.

In the light scattering layer according to the design A of the refractive index, the refractive index of the fine particles having a diameter of 110 nm or less is more preferably 1.47 or lower and still more preferably 1.46 or lower.

Examples of a preferable kind of the fine particles having a diameter of 110 nm or less used in the light scattering layer according to the aspect of the design A of the refractive index include fine particles of magnesium fluoride and silicon oxide (silica). In particular, silica fine particles are preferable from the viewpoints of refractive index, dispersion stability, and costs.

In the light scattering layer according to the aspect of the design A of the refractive index, it is preferable that the binder included in the light scattering layer is formed of at least either the compound having a hydrogen bonding functional group and polymerizable group in a molecule or the organic metal coupling agent.

In the light scattering layer according to the aspect of the design A of the refractive index, the refractive index $n_p$ of the scattering particles having the diameter R of 0.2 to 5 μm included in the light scattering layer is preferably 1.55 to 2.60, more preferably 1.60 to 2.80 and still more preferably 1.90 to 2.70.

In the light scattering layer according to the aspect of the design A of the refractive index, it is preferable that the scattering particles having the diameter R of 0.2 to 5 μm are at least one kind of particles selected from the group consisting of inorganic oxide particles, particles which are formed of a monomer having a fluorene skeleton, and resin particles including inorganic oxide fine particles, and it is more preferable that the scattering particles are formed of inorganic oxide particles.

As a preferable kind of the inorganic oxide particles used as the scattering particles having the diameter R of 0.2 to 5 μm in the light scattering layer according to the aspect of the design A of the refractive index, for example, it is preferable that inorganic particles including an oxide of at least one metal selected from the group consisting of titanium, zirconium, aluminum, indium, zinc, tin, and antimony as a major component are used. In particular, it is more preferable that at least one metal oxide selected from metal oxides including an oxide of at least one metal selected from the group consisting of titanium and zirconium as a major component is used. In addition, among these metals, from the viewpoint of light fastness, zirconium having no photocatalysis is preferable, but titanium having suppressed photocatalysis is also preferably used.

A material of the particles formed of a monomer having a fluorene skeleton, which are used as the scattering particles having the diameter R of 0.2 to 5 μm in the light scattering layer according to the aspect of the design A of the refractive index, can be prepared, for example, by polymerization of a monomer as a bisphenol compound. The particles formed of a monomer having a fluorene skeleton may be formed of a monomer or a polymer as long as the monomer or the polymer has a fluorene skeleton.

In the present invention, it is preferable that the light scattering layer according to the aspect of the design A of the refractive index includes a resin formed of a monomer having a fluorene skeleton which is derived from a bisphenol compound represented by the following Formula (1).

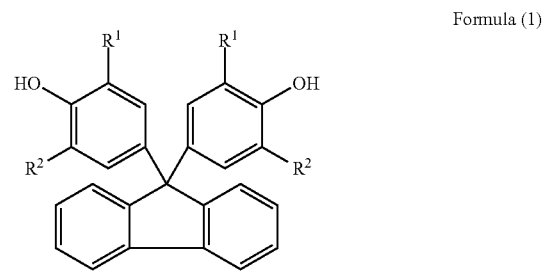

Formula (1)

($R^1$ and $R^2$ each independently represent a hydrogen atom, an alkyl group having 1 to 5 carbon atoms, or a halogen atom and may be the same as or different from each other.)

Specific examples of the monomer having a fluorene skeleton which is derived from the bisphenol compound represented by Formula (1) include 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, and 9,9-bis(4-hydroxy-3,5-dibromophenyl)fluorene. Among these, one kind can be used alone, or two or more kinds can be used in combination.

As a preferable kind of the resin particles including inorganic oxide fine particles which are used as the scattering particles having the diameter R of 0.2 to 5 μm in the light scattering layer according to the aspect of the design A of the refractive index, the following examples can be used.

By including a metal oxide having a high refractive index such as zirconium, titanium, zinc, aluminum, indium, hafnium, scandium, or lanthanum in the form of fine particles having a particle size of 100 nm or less, resin particles can be made to have a desired refractive index. For example, light scattering particles having a high refractive index can be formed by mixing and polymerizing zirconium oxide particles having a diameter of about 15 nm, whose surfaces are modified with a silane coupling agent to be hydrophobic, with a radically polymerizable monomer.

Examples of a well-known method of preparing the resin particles including metal oxide particles include an emulsion polymerization method, a biaxial kneading and pulverizing method, and a biaxial kneading and dissolving method. Examples of the resin particles including titanium oxide fine particles are described in, for example, JP2007-277464A.

—Aspect of Design B of Refractive Index—

In the wavelength conversion member according to the present invention. It is preferable that the refractive index $n_b$ of the constituent elements of the light scattering layer other than the scattering particles is 1.55 to 1.80, that the refractive index $n_p$ of the scattering particles having the diameter R of 0.2 to 5 μm included in the light scattering layer is 1.20 and 1.54, and that the following Expression B-1 is satisfied (hereinafter, also referred to as an aspect of a design B of the refractive index).

$0.04 \leq \Delta n = |n_p - n_b| \leq 0.60$      Expression B-1

In the light scattering layer according to the aspect of the design B of the refractive index, $n_b$ is 1.55 to 1.80, preferably 1.55 to 1.75, and more preferably 1.55 to 1.70, In addition, it is preferable that the following Expression B-2 is further satisfied.

$0.06 \leq \Delta n = |n_p - n_b| \leq 0.20$      Expression B-2

In the aspect of the design B of the refractive index, it is preferable that the light scattering layer includes at least the binder and fine particles having a diameter of 110 nm or less as the constituent elements other than the scattering particles, and that a refractive index of the fine particles having a diameter of 110 nm or less is 1.65 or higher.

In the light scattering layer according to the design B of the refractive index, the refractive index of the fine particles having a diameter of 110 nm or less is more preferably 1.70 or higher and still more preferably 1.75 to 2.80.

Examples of a preferable kind of the fine particles having a diameter of 110 nm or less used in the light scattering layer according to the aspect of the design B of the refractive index are as follows.

It is preferable that inorganic particles including an oxide of at least one metal selected from the group consisting of titanium, zirconium, aluminum, indium, zinc, tin, and antimony as a major component are used. In particular, it is more preferable that at least one metal oxide selected from metal oxides including an oxide of at least one metal selected from the group consisting of titanium and zirconium as a major component is used. In addition, among these metals, from the viewpoint of light fastness, zirconium having no photocatalysis is preferable, but titanium having suppressed photocatalysis is also preferably used.

It is preferable that the light scattering layer according to the aspect of the design B of the refractive index includes not only a binder which is formed of at least either a compound having a hydrogen bonding functional group and a polymerizable group in a molecule or an organic metal coupling agent but also a binder which is formed of a monomer having a fluorene skeleton.

Examples of the monomer having a fluorene skeleton include the above-described examples of the monomer having a fluorene skeleton described regarding the light scattering layer according to the aspect of the design A of the refractive index.

In the light scattering layer according to the aspect of the design B of the refractive index, the refractive index $n_p$ of the scattering particles having the diameter R of 0.2 to 5 μm included in the light scattering layer is preferably 1.20 to 1.54, more preferably 1.30 to 1.53 and still more preferably 1.40 to 1.49.

In the light scattering layer according to the aspect of the design B of the refractive index, the scattering particles having the diameter R of 0.2 to 5 μm are at least one kind of particles selected from the group consisting of inorganic particles, fluorine-containing compound particles, and silicone particles.

Examples of the inorganic particles include fine particles of magnesium fluoride and silicon oxide (silica). In particular, silica fine particles are preferable from the viewpoints of refractive index, dispersion stability, and costs.

Examples of a preferable kind of the fluorine-containing compound particles are as follows:

particles obtained by polymerization using a fluorine polymer ("0015" to "0057") described in JP2011-48359A or a polyfunctional fluorine monomer ("0013" to "0057") described in JP2011-48358A.

It is preferable that the silicone fine particles are formed of a resin having a three-dimensional network structure. For example, a commercially available product having a trade name such as TOSPEARL 103, TOSPEARL 105, TOSPEARL 108, TOSPEARL 120, TOSPEARL 145, TOSPEARL 3120, or TOSPEARL 240 (all of which are manufactured by Toshiba Silicone K.K.) can be used.

(Two or More Kinds of Scattering Particles)

Scattering on the light scattering layer may depend not only on a difference in refractive index which is caused by the scattering particles satisfying Expression 1 but also on surface unevenness. It is also preferable that surface-shaped unevenness is provided on the light scattering layer using particles having substantially no difference in refractive index (Δn) from a particle-containing layer such that the surface unevenness contributes to optical refraction at an interface between the light scattering layer and the wavelength conversion layer. At this time, the difference in refractive index between the light scattering layer and the media of the wavelength conversion layer (the constituent elements other than the scattering particles) may be 0.02 to 0.20 and is preferably 0.02 to 0.15 and more preferably 0.03 to 0.10.

Figure 5:
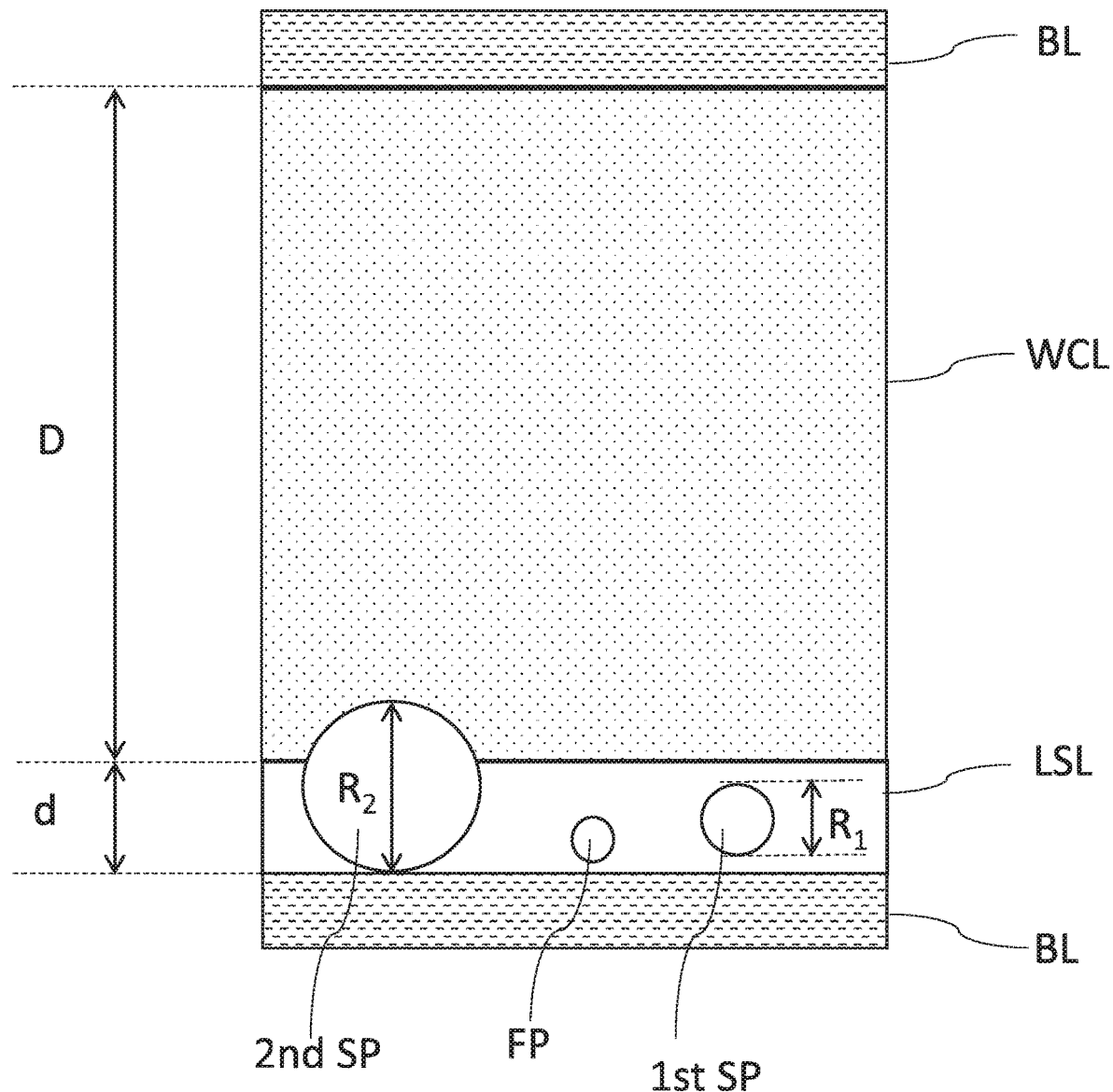
FIG. 5 is a diagram showing an example of a wave length conversion member.

In the wavelength conversion member according to the present invention, it is preferable that the light scattering layer includes first scattering particles and second scattering particles having a larger diameter than the first scattering particles (please see FIG. 5), that a diameter of the first scattering particles is 0.2 to 1 µm, that a diameter of the second scattering particles is more than 1 µm and 5 µm or less, and that the second scattering particles satisfy the following Expression 2.

$$|n_{p2}-n_b|<0.04 \qquad \text{Expression 2}$$

In Expression 2, $n_{p2}$ represents a refractive index of the second scattering particles, and $n_b$ represents the refractive index of the constituent elements of the light scattering layer other than the scattering particles.

It is more preferable that $|n_{p2}-n_b|<0.03$, and it is still more preferable that $|n_{p2}-n_b|<0.02$.

It is preferable that the refractive index $n_{p2}$ of the second scattering particles is adjusted such that the refractive index $n_{p2}$ and the refractive index of the constituent elements of the light scattering layer other than the constituent elements satisfy Expression 2.

The diameter of the first scattering particles is preferably 0.20 to 1 µm, more preferably 0.20 to 0.80 µm, and still more preferably 0.25 to 0.45 µm.

The diameter of the second scattering particles is preferably more than 1 µm and 5 µm or less, more preferably 1.0 to 4.0 µm, and still more preferably 1.0 to 2.5 µm.

It is preferable that the wavelength conversion member according to the present invention satisfies the following Expression 3 from the viewpoint of imparting unevenness to the light scattering layer to improve brightness and scattering uniformity depending on light scattering properties.

$$1.0<R_2/d\leq 4 \qquad \text{Expression 3}$$

In Expression 3, $R_2$ represents the diameter of the second scattering particles in units of µm, and d represents the thickness of the light scattering layer in units of µm.

$R_2/d$ is preferably higher than 1.0 and 3.0 or lower and more preferably 1.3 to 2.5.

In the wavelength conversion member according to the present invention, it is more preferable that the light scattering layer includes first scattering particles and second scattering particles having a larger diameter than the first scattering particles, at least either the first scattering particles or the second scattering particles are the scattering particles having the diameter R of 0.2 to 5 µm, the second scattering particles satisfy the following Expression 3, and the first scattering particles satisfy the following Expression 4.

$$1.0<R_2/d\leq 4 \qquad \text{Expression 3}$$

$$0.05\leq R_1/d\leq 1.0 \qquad \text{Expression 4}$$

In Expressions 3 and 4, $R_2$ represents the diameter of the second scattering particles in units of µm, $R_1$ represents a diameter of the first scattering particles in units of µm, and d represents the thickness of the light scattering layer in units of µm.

In Expression 4, $R_1/d$ is preferably 0.05 to 1.0, more preferably 0.08 to 0.8, and still more preferably 0.10 to 0.7.

It is preferable that the refractive index of the second scattering particles satisfying Expression 3 is in the range of Expression 2. By using the scattering particles having a refractive index similar to that of the light scattering layer in a region which is equal to or more than the thickness of the scattering layer, the surface of the light scattering layer has convex portions without being smooth. In particular, in a case where the refractive indices of the light scattering layer and the wavelength conversion layer are different from each other, light refracts at an interface between the layers, which is efficient for eliminating unevenness in brightness or color.

It is preferable that the refractive index of the first scattering particles satisfying Expression 4 is in the range of Expression 1. By using the scattering particles having a large difference in refractive index from that of the periphery in a region which is equal to or less than the thickness of the scattering layer in the light scattering layer, wide angle scattering can be efficiently performed, and an optical path length in the wavelength conversion layer increases, which has a large effect on the improvement of brightness.

(Fine Particles having Diameter of 110 nm or Less)

It is preferable that the light scattering layer includes the binder and fine particles having a diameter of 110 nm or less as the constituent elements other than the scattering particles from the viewpoint of adjusting the refractive index of the constituent elements of the light scattering layer other than the scattering particles.

The diameter of the fine particles having a diameter of 110 nm or less is preferably 0.5 to 80 nm and more preferably 1 to 40 nm.

As a preferable kind of the fine particles having a diameter of 110 nm, the examples described above in the aspects of the design A and the design B of the refractive index of the light scattering layer can be used.

Examples of a preferable kind of the second scattering particles are as follows.

As organic particles, for example, silicone beads (refractive index: 1.42), polymethyl methacrylate beads (refractive index: 1.49), acryl-styrene copolymer beads (refractive index: 1.49 to 1.60), melamine beads (refractive index: 1.57), polycarbonate beads (refractive index: 1.57), styrene beads (refractive index: 1.60), melamine beads (refractive index: 1.60), crosslinked polystyrene beads (refractive index: 1.61), polyvinyl chloride beads (refractive index: 1.60), fluorene beads (refractive index: 1.63), amino resin particles formed of melamine and benzoguanamine (refractive index: 1.63), or benzoguanamine-melamine formaldehyde beads (refractive index: 1.68) are used.

As inorganic particles, for example, silica beads (refractive index: 1.44) or alumina beads (refractive index: 1.63) are used.

In addition, resin particles including inorganic particles having a particle size of about 110 nm and having a higher refractive index or a lower refractive index than a resin component can be used. The resin particles are formed of a composite of so-called nanoparticles and an organic resin, and the refractive index thereof can be adjusted in a wide range by adjusting the refractive index of the inorganic particles used and a mixing ratio in the composite. For example, in a case where acrylic composite particles are prepared using zirconium oxide having a refractive index of 2.20 and a particle size of 10 nm, composite particles having a refractive index in a range of 1.55 to 1.75 can be formed.

As the inorganic particles, for example, silica, magnesium fluoride, tin oxide, zinc oxide, alumina, or titanium oxide can be used.

(Thickness of Light Scattering Layer)

In the wavelength conversion member according to the present invention, the thickness d of the light scattering layer is 0.2 to 4 µm. The thickness d of the light scattering layer is preferably 0.2 to 3 µm and more preferably 0.4 to 1.8 µm.

The thickness of the light scattering layer is defined as the thickness ranging from a surface of an inorganic barrier layer to an upper end of a region where the binder and/or the scattering particles which form the light scattering layer are present, In this specification, the thickness d of the light scattering layer is obtained using a first measuring method or a second measuring method described below. The first measuring method is used preferentially over the second measuring method.

First Measuring Method

The wavelength conversion member is cut obliquely at an angle of 2° using a microtome, and then a cut cross-section of the obtained film is analyzed by TOF-SIMS. The thickness of the light scattering layer is calculated by mapping focusing on characteristic ions of the components included in the light scattering layer (magnification: 28 times).

In the measurement using TOF-SIMS, the following device is used.

Device: TRIFT II manufactured by Physical Electronics Inc. (PHI)

The specimen is observed over a length of 50 µm, and the average thickness is obtained as the thickness d of the light scattering layer.

Second Measuring Method

In a case where characteristic ions easily detected by TOF-SIMS are not present in the light scattering layer, mapping is performed on the wavelength conversion layer side. A side where the quantum dots are not present is determined as the light scattering layer, and the thickness of the light scattering layer is detected using the first measuring method.

The specimen is observed over a length of 50 µm, and the average thickness is obtained as the thickness d of the light scattering layer.

In the wavelength conversion member according to the present invention, a ratio of the thickness d of the light scattering layer to the thickness D of the wavelength conversion layer is 0.2% to 10%. In a case where two light scattering layers are provided, the above-described ratio is calculated using the total thickness of the two light scattering layers.

The ratio of the thickness d of the light scattering layer to the thickness D of the wavelength conversion layer is preferably 0.4% to 6% and more preferably 0.6% to 3%.

<Support>

From the viewpoints of strength improvement, easy film forming, and the like, the wavelength conversion member may include a support. It is preferable that the support is included as a substrate film of a barrier film described below. In the wavelength conversion member, an inorganic layer described below and the support may be provided in this order, or the wavelength conversion layer, an inorganic layer described below, an organic layer described below, and the support may be provided in this order. The support may be disposed between an organic layer and an inorganic layer, or between two inorganic layers. In addition, one support or two or more supports are provided in the wavelength conversion member, or the wavelength conversion member may have a structure in which the support, the wavelength conversion layer, and the support are laminated. It is preferable that the support is a transparent support which is transparent to visible light. Here, "transparent to visible light" represents that the light transmittance in the visible range is 80% or higher and preferably 85% or higher. The light transmittance used as an index for transparency can be measured using a method described in JIS-K 7105. That is, using an integrating sphere light transmittance measuring device, the total light transmittance and the scattered light amount are measured, and the diffuse transmittance is subtracted from the total light transmittance to obtain the light transmittance. The details of the support can be found in paragraphs "0046" to "0052" of JP2007-290369A and paragraphs "0040" to "0055" of JP2005-096108A. From the viewpoints of gas barrier properties, impact resistance, and the like, the thickness of the support is preferably 10 µm to 500 µm, more preferably 20 to 400 µm, and still more preferably 30 to 300 µm.

<Barrier Film>

The wavelength conversion member according to the present invention includes two barrier layers, in which one of the barrier layers closest to the light scattering layer is formed of an inorganic component.

It is preferable that the wavelength conversion members includes two barrier films including two barrier layers. The barrier film is a film having a gas barrier function of blocking oxygen. It is also preferable that the barrier film has a function of blocking water vapor.

It is preferable that the wavelength conversion member has a structure in which the barrier film, the light scattering layer, the wavelength conversion layer, and the barrier film are laminated in this order, or a structure in which the barrier film, the light scattering layer, the wavelength conversion layer, the light scattering layer, and the barrier film are laminated in this order. In a case where the wavelength conversion member includes two light scattering layers, the thicknesses and compositions of the two light scattering layers may be the same as or different from each other. In a case where the wavelength conversion member has the structure in which the barrier film, the light scattering layer, the wavelength conversion layer, and the barrier film are laminated in this order, the light scattering layer may be disposed on a light incidence side or a light exit side of the wavelength conversion layer, which can be optionally set in consideration of a combination with other members in a backlight unit.

The barrier film may be a well-known barrier film or may be, for example, a barrier film described below.

The barrier film may include at least an inorganic layer and may be a film including a substrate film and an inorganic layer. The details of the substrate film can be found in the above description of the support. The barrier film may include a barrier laminate which includes at least one inorganic layer and at least one organic layer on a substrate film. It is preferable that multiple layers are laminated as described above because barrier properties can be further improved. On the other hand, as the number of layers laminated increases, the light transmittance of the wavelength conversion member is likely to decrease. Therefore, it is preferable to increase the number of layers laminated in a range where a high light transmittance can be maintained. Specifically, the total light transmittance of the barrier film in the visible range is preferably 80% or higher, and the oxygen permeability thereof is preferably 1.00 cm$^3$/(m$^2$·day·atm) or lower. Here, the oxygen permeability of the barrier film is a value measured using an oxygen permeability measuring device (trade name: OX-TRAN 2/20, manufactured by Mocon Inc.) under conditions of measurement temperature: 23° C. and relative humidity: 90%. In addition, the visible range refers to a wavelength range of 380 nm to 780 nm, and the total light transmittance refers to an average light transmittance value in the visible range.

The oxygen permeability of the barrier film is more preferably 0.10 cm$^3$/(m$^2$·day·atm) or lower, and still more preferably 0.01 cm$^3$/(m$^2$·day·atm) or lower. The total light transmittance in the visible range is more preferably 90% or higher. The lower the oxygen permeability, the better. In addition, the higher the total light transmittance in the visible range, the better.

In this specification, "barrier layer" is defined as "layer having an oxygen permeability of 1.00 cm$^3$/(m$^2$·day·atm) or lower".

(Inorganic Layer)

"Inorganic layer" is a layer including an inorganic material as a major component and is preferably a layer consisting only of an inorganic material. On the other hand, "organic layer" is a layer including an organic material as a major component in which the content of the organic material is preferably 50 mass % or higher, more preferably 80 mass % or higher, and still more preferably 90 mass % or higher.

The inorganic material constituting the inorganic layer is not particularly limited, and various inorganic compounds such as a metal, an inorganic oxide, an inorganic nitride, or an inorganic oxynitride can be used. As an element constituting the inorganic material, silicon, aluminum, magnesium, titanium, tin, indium, or cerium is preferable. The inorganic material may include one element or two or more elements among the above elements. Specific examples of the inorganic compound include silicon oxide, silicon oxynitride, aluminum oxide, magnesium oxide, titanium oxide, tin oxide, an indium oxide alloy, silicon nitride, aluminum nitride, and titanium nitride. In addition, as the inorganic layer, a metal film such as an aluminum film, a silver film, a tin film, a chromium film, a nickel film, or a titanium film may be provided.

Among the inorganic materials, silicon nitride, silicon oxide, or silicon oxynitride is more preferable. Since the inorganic layer formed of the above materials has excellent adhesiveness with the organic layer, barrier properties can be further improved.

A method of forming the inorganic layer is not particularly limited. For example, various film forming methods in which a film forming material can be evaporated or scattered to be deposited on a deposition target surface can be used.

Examples of the method of forming the inorganic layer include: a vacuum deposition method of heating and depositing an inorganic material such as an inorganic oxide, an inorganic nitride, an inorganic oxynitride, or a metal; an oxidation deposition method of introducing oxygen gas and oxidizing an inorganic material as a raw material for deposition; a sputtering method of introducing argon gas and oxygen gas and sputtering an inorganic material as a target material for deposition; a physical vapor deposition (PVD) method, such as an ion plating method, of heating an inorganic material with a plasma beam generated by a plasma gun for deposition; and in a case where a deposited film formed of silicon oxide is formed, a chemical vapor deposition (CVD) method of using an organic silicon compound as a raw material. Vapor deposition may be performed on a surface of the support, the substrate film, the wavelength conversion layer, or the organic layer as a substrate.

The thickness of the inorganic layer may be 1 nm to 500 nm and is preferably 5 nm to 300 nm and more preferably 10 nm to 150 nm. By adjusting the thickness of the inorganic layer closest to the light scattering layer to be in the above-described range, reflection in the inorganic layer can be suppressed while realizing excellent barrier properties, and the wavelength conversion member having a high light transmittance can be provided.

(Organic Layer)

The details of the organic layer can be found in paragraphs "0020" to "0042" of JP2007-290369A and paragraphs "0074" to "0105" of JP2005-096108A. It is preferable that the organic layer includes a cardo polymer. As a result, adhesiveness between the organic layer and an adjacent layer, in particular, adhesiveness between the organic layer and the inorganic layer is improved, and more favorable barrier properties can be realized. The details of the cardo polymer can be found in paragraphs "0085" to "0095" of JP2005-096108A. The thickness of the organic layer is preferably in a range of 0.05 μm to 10 μm and more preferably in a range of 0.5 to 10 μm. In a case where the organic layer is formed using a wet coating method, the thickness of the organic layer is preferably in a range of 0.5 to 10 μm and more preferably in a range of 1 μm to 5 μm. In a case where the organic layer is formed using a dry coating method, the thickness of the organic layer is preferably in a range of 0.05 μm to 5 μm and more preferably in a range of 0.05 μm to 1 μm. By adjusting the thickness of the organic layer, which is formed using a wet coating method or a dry coating method, adhesiveness with the inorganic layer can be further improved.

In the laminate structure of the wavelength conversion member according to the present invention, one of the barrier layers closest to the light scattering layer is formed of an inorganic component. On the other hand, in the laminate structure of the wavelength conversion member according to the present invention, it is preferable that the inorganic layer of the barrier layer is in directly contact with the wavelength conversion layer. However, an organic layer may be provided between the inorganic layer and the wavelength conversion layer within a range where the effects of the present invention do not deteriorate.

Other details of the inorganic layer and the organic layer can be found in JP2007-290369A, JP2005-096108A, and US2012/0113672A1.

[Method of Manufacturing Wavelength Conversion Member]

A method of manufacturing the wavelength conversion member according to the present invention is not particularly limited. In particular, the following method of manufacturing a wavelength conversion member according to the present invention is preferable.

According to the present invention, there is provided a method of manufacturing a wavelength conversion member in which a wavelength conversion layer including quantum dots is interposed between two barrier layers, the method including:

a step of forming a light scattering layer by laminating a binder and a light scattering layer-forming composition on a first barrier layer formed of an inorganic component such that a thickness d of the light scattering layer is 0.2 to 4 μm, the binder being formed of at least either a compound having a hydrogen bonding functional group and a polymerizable group in a molecule or an organic metal coupling agent, and the light scattering layer-forming composition including scattering particles having a diameter R of 0.2 to 5 μm;

a step of laminating a wavelength conversion layer-forming composition including quantum dots on the light scattering layer such that a thickness D of the wavelength conversion layer is 10 to 100 μm and such that a ratio of the thickness d of the light scattering layer to the thickness D of the wavelength conversion layer is 0.2% to 10%; and a step of laminating a second barrier layer on the wavelength conversion layer.

(Method of Forming Light Scattering Layer)

The method of manufacturing the wavelength conversion member according to the present invention includes a step of forming a light scattering layer by laminating a binder and a light scattering layer-forming composition on a first barrier layer formed of an inorganic component such that a thickness d of the light scattering layer is 0.2 to 4 μm, the binder being formed of at least either a compound having a hydrogen bonding functional group and a polymerizable group in a molecule or an organic metal coupling agent, and the light scattering layer-forming composition including scattering particles having a diameter R of 0.2 to 5 μm.

As a method of forming a light scattering layer by laminating a light scattering layer-forming composition on a first barrier layer formed of an inorganic component such that a thickness d of the light scattering layer is 0.2 to 4 μm, the light scattering layer-forming composition can be applied to the surface of the first barrier layer formed of an inorganic component. A solvent is not particularly limited. In a case where the organic metal coupling agent is used in the light scattering layer-forming composition and the organic metal coupling agent has a functional group (hydrolyzable group) which is hydrolyzable in the presence of water, water or a mixed solvent of water and an organic solvent is preferable as the solvent. The organic solvent used in combination with water may be, for example, an alcohol but is not limited thereto. In addition, in a case where the organic metal coupling agent is used in the light scattering layer-forming composition, the light scattering layer-forming composition may include an acid in order to promote hydrolysis. The acid may be, for example, acetic acid but is not limited thereto. The content of the polymerizable compound for forming the binder, the content of the solvent, and the content of optionally added components such as an acid in the light scattering layer-forming composition may be appropriately adjusted. A method of applying the light scattering layer-forming composition is not particularly limited. It is preferable that a surface treatment is performed using a roll-to-roll method from the viewpoint of productivity. Specifically, with a roll-to-roll method using a well-known coater, the light scattering layer-forming composition can be applied to a film including at least a target layer and can be dried. By performing a treatment for providing the light scattering layer, the adhesiveness between the inorganic layer and the wavelength conversion layer can be further improved.

(Method of Forming Wavelength Conversion Layer)

The method of manufacturing the wavelength conversion member according to the present invention includes a step of laminating a wavelength conversion layer-forming composition including quantum dots on the light scattering layer such that a thickness D of the wavelength conversion layer is 10 to 100 μm and such that a ratio of the thickness d of the light scattering layer to the thickness D of the wavelength conversion layer is 0.2% to 10%.

The wavelength conversion layer can be formed by applying the wavelength conversion layer-forming composition to the light scattering layer and curing the wavelength conversion layer-forming composition by light irradiation or heating.

Examples of a method of applying the wavelength conversion layer-forming composition include various coating methods such as a curtain coating method, a dip coating method, a spin coating method, a printing coating method, a spray coating method, a slot coating method, a roll coating method, a slide coating method, a blade coating method, a gravure coating method, or a wire bar method.

Curing conditions can be appropriately set depending on the kind of the polymerizable compound used and the composition of the wavelength conversion layer-forming composition. In addition, in a case where the wavelength conversion layer-forming composition includes a solvent, a drying treatment is performed to remove the solvent before curing.

(Method of Forming Second Barrier Layer)

The method of manufacturing the wavelength conversion member according to the present invention includes a step of laminating a second barrier layer on the wavelength conversion layer. A method of laminating the second barrier layer is not particularly limited.

The curing of the wavelength conversion layer-forming composition may be performed in a state where the wavelength conversion layer-forming composition is interposed between the second barrier layer and a laminate in which the first barrier layer formed of an inorganic component and the light scattering layer (or the light scattering layer-forming composition) are laminated. It is preferable that the method of manufacturing the wavelength conversion member according to the present invention includes a step of forming the wavelength conversion layer by applying an external stimulus to the wavelength conversion layer-forming composition interposed between the light scattering layer and the second barrier layer to cure the wavelength conversion layer-forming composition. An aspect of steps of manufacturing the wavelength conversion member including a curing treatment will be described below with reference to the drawings. However, the present invention is not limited to the following configuration.

Figure 2:
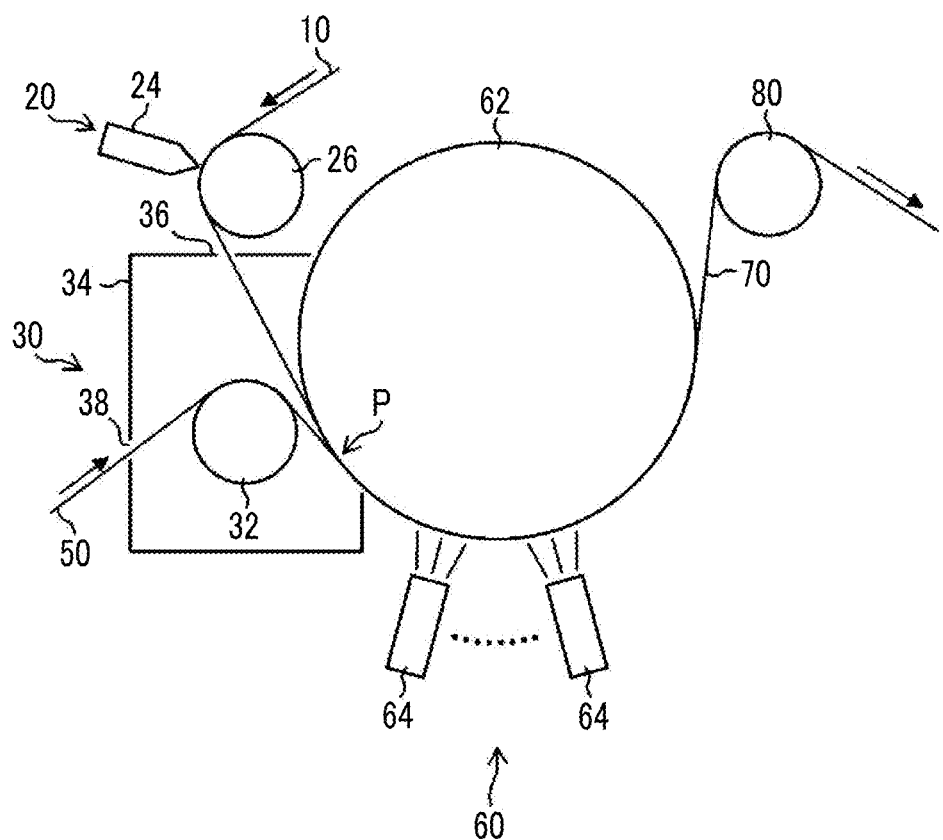
FIG. 2 is a diagram showing a schematic configuration of an example of a device for manufacturing the wavelength conversion member.
Figure 3:
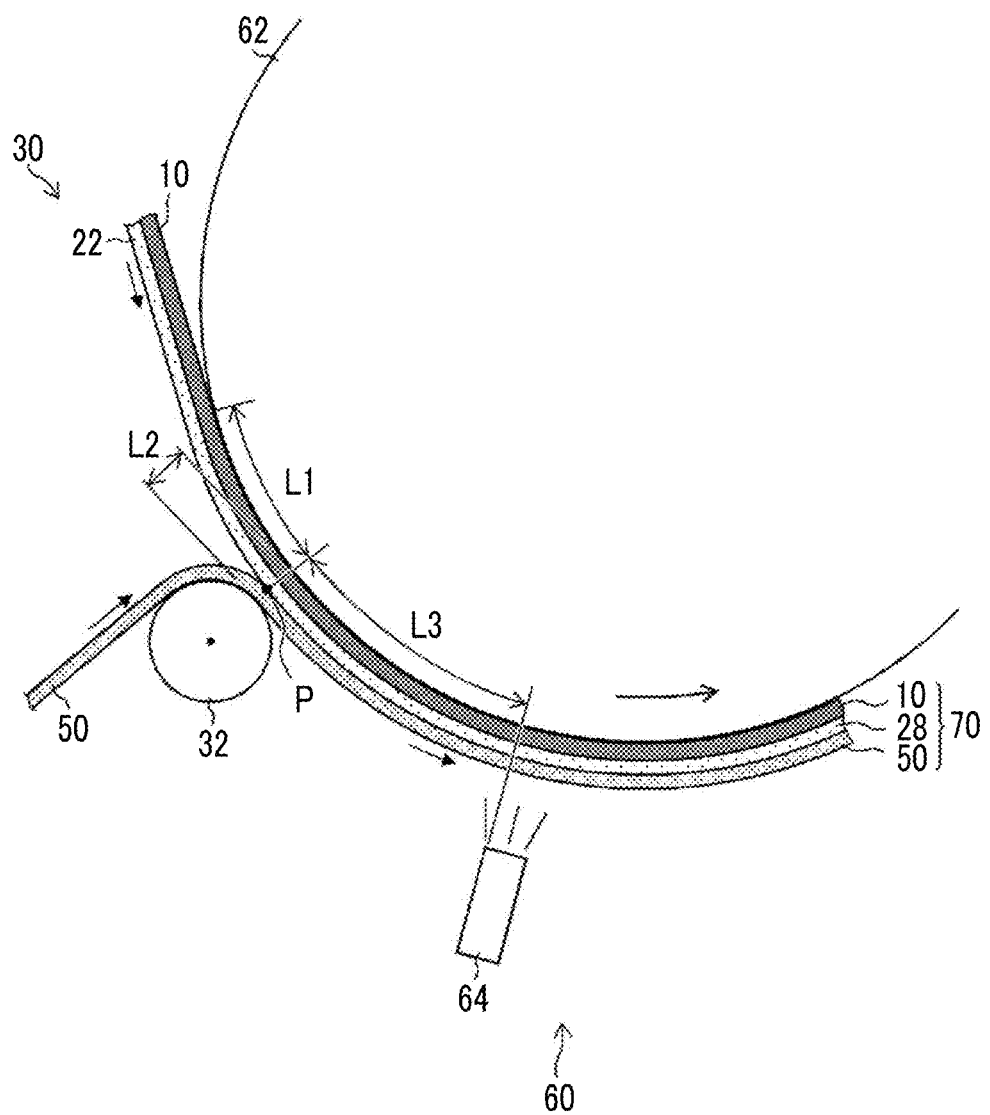
FIG. 3 is an enlarged view showing a part of the manufacturing device shown in FIG. 2.

FIG. 2 is a diagram showing a schematic configuration of an example of a device for manufacturing the wavelength conversion member. FIG. 3 is an enlarged view showing a part of the manufacturing device shown in FIG. 2. It is preferable that steps of manufacturing the wavelength conversion member using the manufacturing device shown in FIGS. 2 and 3 include at least: a step of forming a coating film by applying the wavelength conversion layer-forming composition to a surface of the first substrate (the laminated film in which the light scattering layer is formed on the first barrier layer formed of an inorganic component; hereinafter, referred to as "first film") which is continuously transported; a step of interposing the coating film between the first film and the second film by laminating the second substrate (the film including the second barrier layer; hereinafter, referred to as "second film"), which is continuously transported, on the coating film; and a step of forming the wavelength conversion layer (cured layer) by winding any one of the first film and the second film around a backup roller in a state where the coating film is interposed between the first film and the second film, and irradiating the coating film with light to be cured and polymerized while being continuously transported. In addition, by using the barrier film as each of the first film and the second film the wavelength conversion member in which opposite surfaces of the wavelength conversion layer are protected by the barrier films can be obtained.

More specifically, first, the first film 10 is continuously transported from a transporter (not shown) to a coating portion 20. The first film 10 is transported from the transporter at a transport speed of, for example, 1 to 50 m/min. In this case, the transport speed is not limited to the above value. During the transportation, for example, a tension of 20 to 150 N/m and preferably 30 to 100 N/m is applied to the first film 10.

In the coating portion 20, the wavelength conversion layer-forming composition (hereinafter, also referred to as "coating solution") is applied to a surface of the first film 10, which is continuously transported, to form a coating film 22 (refer to FIG. 3) thereon. In the coating portion 20, for example, a die coater 24 and a backup roller 26 which is disposed to face the die coater 24 are provided. A surface of the first film 10 opposite to the surface on which the coating film 22 is formed is wound around the backup roller 26, and the coating solution is applied from a jetting port of the die coater 24 to the surface of the first substrate 10 which is continuously transported, to form the coating film 22 thereon. Here, the coating film 22 refers to the wavelength conversion layer-forming composition which is applied to the first film 10 and is not cured.

In the embodiment, the die water 24 to which an extrusion coating method is applied is used as a coating device, but the present invention is not limited thereto. For example, coating devices to which various methods such as a curtain coating method, an extrusion coating method, a rod coating method, or a roll coating method are applied can be used.

The first film 10 which has passed through the coating portion 20 and on which the coating film 22 is formed is continuously transported to a laminating portion 30. In the laminating portion 30, the second film 50 which is continuously transported is laminated on the coating film 22 such that the coating film 22 is interposed between the first film 10 and the second film 50.

In the laminating portion 30, a laminating roller 32 and a heating chamber 34 which surrounds the laminating roller 32 are provided. In the heating chamber 34, an opening 36 through which the first film 10 passes and an opening 38 through which the second film 50 passes are provided.

At a position opposite to the laminating roller 32, a backup roller 62 is disposed. The first film 10 on which the coating film 22 is formed is continuously transported to a laminating position P in a state where a surface opposite to the surface on which the coating film 22 is formed is wound around the backup roller 62. The laminating position P refers to a position where contact between the second film 50 and the coating film 22 starts. It is preferable that the first film 10 is wound around the backup roller 62 before reaching the laminating, position P. The reason for this is that, even in a case where wrinkles are formed in the first film 10, the wrinkles are corrected and removed by the backup roller 62 before reaching the laminating position P. Therefore, it is preferable that a distance L1 from a position (contact position) where the first film 10 is wound around the backup roller 62 to the laminating position P is long. For example, the distance L1 is preferably 30 mm or longer, and the upper limit value thereof is typically determined based on a diameter and a pass line of the backup roller 62.

In the embodiment, the second film 50 is laminated by the backup roller 62 which is used in a curing portion 60 and the laminating roller 32. That is, the backup roller 62 which is used in the curing portion 60 also functions as a roller used in the laminating portion 30. However, the present invention is not limited to this configuration. A laminating roller other than the backup roller 62 may be provided in the laminating portion 30 such that the backup roller 62 does not function as a roller used in the laminating portion 30.

By using the backup roller 62, which is used in the curing portion 60, in the laminating portion 30, the number of rollers can be reduced. In addition, the backup roller 62 can also be used as a heat roller for heating the first film 10.

The second film 50 transported from a transporter (not shown) is wound around the laminating roller 32 and is continuously, transported between the laminating roller 32 and the backup roller 62. At the laminating position P, the second film 50 is laminated on the coating film 22 formed on the first film 10. As a result, the coating film 22 is interposed between the first film 10 and the second film 50. Laminating described herein represents that the second film 50 is laminated on the coating film 22.

It is preferable that a distance L2 between the laminating roller 32 and the backup roller 62 is more than the total thickness of the first film 10, the wavelength conversion layer (cured layer) 28 obtained by polymerizing and curing the coating film 22, and the second film 50. In addition, it is preferable that L2 is equal to or less than a length obtained by adding 5 mm to the total thickness of the first film 10, the coating film 22, and the second film 50. By adjusting the distance L2 to be equal to or less than the length obtained by adding 5 mm to the total thickness, permeation of bubbles into a gap between the second film 50 and the coating film 22 can be prevented. Here, the distance L2 between the laminating roller 32 and the backup roller 62 refers to the shortest distance between the outer circumferential surface of the laminating roller 32 and the outer circumferential surface of the backup roller 62.

Regarding the rotational accuracy of the laminating roller 32 and the backup roller 62, the radial run-out is 0.05 or less and preferably 0.01 or less. As the radial run-out decreases, the thickness distribution of the coating film 22 can be reduced.

In addition, in order to suppress thermal deformation after the coating film 22 is interposed between the first film 10 and the second film 50, a difference between the temperature of the backup roller 62 and the temperature of the first film 10 in the curing portion 60 and a difference between the temperature of the backup roller 62 and the temperature of the second film 50 are preferably 30° C. or lower, more preferably 15° C. or lower, and still more preferably 0° C.

In a case where the heating chamber 34 is provided in order to reduce the differences from the temperature of the backup roller 62, it is preferable that the first film 10 and the second film 50 are heated in the heating chamber 34. For example, hot air is supplied from a hot air blower (not shown) into the heating chamber 34 such that the first film 10 and the second film 50 can be heated.

The first film 10 may be wound around the backup roller 62 whose temperature is controlled such that the first film 10 is heated by the backup roller 62.

On the other hand, regarding the second film 50, by using a heat roller as the laminating roller 32, the second film 50 can be heated by the laminating roller 32.

In this case, the heating chamber 34 and the heat roller are not essential and can be optionally provided.

Next, the coating film 22 is continuously transported to the curing portion 60 while interposed between the first film 10 and the second film 50. In the configuration shown in the drawing, curing in the curing portion 60 is performed by light irradiation. However, in a case where the polymerizable compound included in the wavelength conversion layer-forming composition is polymerizable by heating, curing can be performed by heating such as blowing of warm air.

At a position opposite to the backup roller 62, a light irradiating device 64 is provided. The first film 10 and the second film 50 between which the coating film 22 is interposed are continuously transported between the backup roller 62 and the light irradiating device 64. Light irradiated by the light irradiating device may be determined depending on the kind of the photopolymerizable compound in the wavelength conversion layer-forming composition. For example, ultraviolet light is used. Here, the ultraviolet light refers to light in a wavelength range of 280 to 400 nm. As a light source which emits ultraviolet light, for example, a low-pressure mercury lamp, a middle-pressure mercury lamp, a high-pressure mercury lamp, an ultrahigh-pressure mercury lamp, a carbon arc lamp, a metal halide lamp, or a xenon lamp can be used. The irradiation dose may be determined in a range where the polymerization and curing reaction can be performed. For example, the coating film 22 is irradiated with ultraviolet light in an irradiation dose of 100 to 10000 mL/cm$^2$.

In the curing portion 60, the first film 10 is wound around the backup roller 62 in a state where the coating film 22 is interposed between the first film 10 and the second film 50, and the coating film 22 is irradiated with light by the light irradiating device 64 while being continuously transported. As a result, the coating film 22 is cured to form the wavelength conversion layer (cured layer) 28.

In the embodiment, the first film 10 side is wound around the backup roller 62 and is continuously transported. However, the second film 50 may be wound around the backup roller 62 and may be continuously transported.

"Being around the backup roller 62" represents a state where any one of the first film 10 and the second film 50 is in contact with a surface of the backup roller 62 at a given lap angle. Accordingly, the first film 10 and the second film 50 move in synchronization with the rotation of the backup roller 62 while being continuously transported. Any one of the first film 10 and the second film 20 only has to be wound around the backup roller 62 while at least being irradiated with ultraviolet light.

The backup roller 62 includes a main body having a cylindrical shape and a rotating shaft that is disposed at opposite end portions of the main body. The main body of the backup roller 62 has a diameter of, for example, 200 to 1000 mm. The diameter of the backup roller 62 is not particularly limited. The diameter is preferably 300 to 500 mm from the viewpoints of curling deformation of the laminated film, facility costs, and rotational accuracy. By mounting a temperature controller on the main body of the backup roller 62, the temperature of the backup roller 62 can be controlled.

The temperature of the backup roller 62 can be determined in consideration of heat generation during the light irradiation, the curing efficiency of the coating film 22, and the wrinkling of the first film 10 and the second film 50 on the backup roller 62. The temperature of the backup roller 62 is set to be in a temperature range of preferably 10° C. to 95° C. and more preferably 15° C. to 85° C. Here, the temperature regarding a roller refers to the surface temperature of the roller.

A distance L3 between the laminating position P and the light irradiating device 64 can be made to be, for example, 30 mm or more.

The coating film 22 is irradiated with light to form the cured layer 28, and a wavelength conversion member 70 including the first film 10, the cured layer 28, and the second film 50 is manufactured. The wavelength conversion member 70 is peeled off from the backup roller 62 by a peeling roller 80. The wavelength conversion member 70 is continuously transported to a winder (not shown) and then is wound in a roll shape by the winder.

Hereinabove, the one aspect of the manufacturing steps of the wavelength conversion member have been described. However, the present invention is not limited to the above-described configurations. In addition, the wavelength conversion layer (cured layer) may be prepared by applying the wavelength conversion layer-forming composition to the substrate such as the support or the barrier film, laminating an additional substrate thereon, and performing curing after drying which is optionally performed. One or more other layers such as an inorganic layer can also be laminated on the formed wavelength conversion layer using a well-known method.

[Backlight Unit]

The wavelength conversion member according to the present invention an be used as a component of a backlight unit.

A backlight unit according to the present invention includes at least the wavelength conversion member according to the present invention and a light source. It is preferable that the backlight unit includes at least the wavelength conversion member according to the present invention and a blue light source or an ultraviolet light source.

<Emission Wavelength of Backlight Unit>

From the viewpoint of realizing high brightness and high color reproducibility, it is preferable that the backlight unit includes a multi-wavelength light source. For example, it is preferable that blue light having a center emission wavelength in a wavelength range of 430 to 480 nm and having a full width at half maximum of emission peak of 100 nm or less, green light having a center emission wavelength in a wavelength range of 520 to 560 nm and having a full width at half maximum of emission peak of 100 nm or less, and red light having a center emission wavelength in a wavelength range of 600 to 680 nm and having a full width at half maximum of emission intensity peak of 100 nm or less are emitted.

From the viewpoint of further improving brightness and color reproducibility, the wavelength range of the blue light emitted from the backlight unit is more preferably 440 to 460 nm.

From the same viewpoint, the wavelength range of the green light emitted from the backlight unit is more preferably 520 to 545 nm.

In addition, from the same viewpoint, the wavelength range of the red light emitted from the backlight unit is more preferably 610 to 640 nm.

In addition, from the same point, the full width at half maximum of the emission intensity of each of the blue light, the green light, and the red light emitted from the backlight unit is preferably 80 nm or less, more preferably 50 nm or less, still more preferably 40 nm or less, and still more preferably 30 nm or less. In particular, it is more preferable that the full width at half maximum of the emission intensity of the blue light is 25 nm or less.

The backlight unit includes at least the wavelength conversion member and a light source. In one aspect, a light source (blue light source) which emits blue light having a center emission wavelength in a wavelength range of 430 nm to 480 nm, for example, a blue light emitting diode which emits blue light can be used as the light source. In a case where a light source emitting blue light is used, the wavelength conversion layer includes at least: the quantum dots (A) that are excited by excitation light to emit red light; and the quantum dots (B) that are excited by excitation light to emit green light. As a result, white light can be realized by blue light, which has been emitted from the light source and has passed through the wavelength conversion member, and red light and green light which have been emitted from the wavelength conversion member.

In addition, in another configuration, a light source (ultraviolet light source) which emits ultraviolet light having a center emission wavelength in a wavelength range of 300 nm to 430 nm, for example, an ultraviolet light emitting diode can be used as the light source. In this case, the wavelength conversion layer includes not only the quantum dots (A) and (B) but also the quantum dots (C) that are excited by excitation light to emit blue light. As a result, white light can be realized by red light, green light, and blue light emitted from the wavelength conversion member.

In addition, in another configuration, a laser light source can also be used instead of a light emitting diode.

<Configuration of Backlight Unit>

The backlight unit may be an edge light mode backlight unit including a light guide plate, a reflection plate, and the like as components. FIGS. 1A and 1B show an example of the edge light mode backlight unit. As the light guide plate, a well-known light guide plate can be used without any particular limitation. However, the backlight unit may be a direct backlight mode.

In addition, in the backlight unit, a reflection member may also be provided at a rear portion of the light source. As the reflection member, a well-known reflection plate can be used without any particular limitation. The details of the reflection member can be found in JP3416302B, JP3363565B, JP4091978B, and JP3448626B, the contents of which are incorporated herein by reference, In addition, it is also preferable that the backlight unit includes a well-known diffusion plate, a diffusion sheet, a prism sheet (for example, BEF series, manufactured by Sumitomo 3M Ltd.), or a light guide. The configuration of the other members can be found in JP3416302B, JP3363565B, JP4091978B, and JP3448626B, the contents of which are incorporated herein by reference.

[Image Display Device]

The wavelength conversion member and the backlight unit according to the present invention is applicable to an image display device such as a liquid crystal display device.

The image display device according to the present invention includes at least the wavelength conversion member according to the present invention or the backlight unit according to the present invention. It is preferable that the image display device is a liquid crystal display device including a liquid crystal cell.

<Configuration of Liquid Crystal Display Device>

As a driving mode of the liquid crystal cell, various modes such as a twisted nematic (TN) mode, a super twisted nematic (STN) mode, a vertical alignment (VA) mode, an in-plane switching (IPS) mode, or an optically compensated bend (OCB) mode can be used without any particular limitation. The liquid crystal cell is preferably a VA mode, an OCB mode, an IPS mode, or a TN mode but is not limited thereto. Examples of the configuration of the VA mode liquid crystal display device include a configuration shown in FIG. 2 described in JP2008-262161A. However, a specific configuration of the liquid crystal display device is not particularly limited, and a well-known configuration can be adopted.

A liquid crystal display device according to one embodiment includes a liquid crystal cell in which a liquid crystal layer is interposed between substrates facing each other at least of which includes an electrode. This liquid crystal cell is disposed between two polarizing plates. The liquid crystal display device includes a liquid crystal cell in which liquid crystal is sealed between upper and lower substrates, and displays an image by applying a voltage to change the orientation state of liquid crystal. Further optionally, the liquid crystal display device further includes a polarizing plate protective film, an optical compensation member for optical compensation, or a sub-functional layer such as an adhesive layer. Further, in addition to (or instead of) a color filter substrate, a thin film transistor substrate, a lens film, a diffusion sheet, a hard coat layer, an anti-reflection layer, a low-reflection layer, or an anti-glare layer, a surface layer such as a forward scattering layer, a primer layer, an antistatic layer, or a undercoat layer may be disposed.

Figure 4:
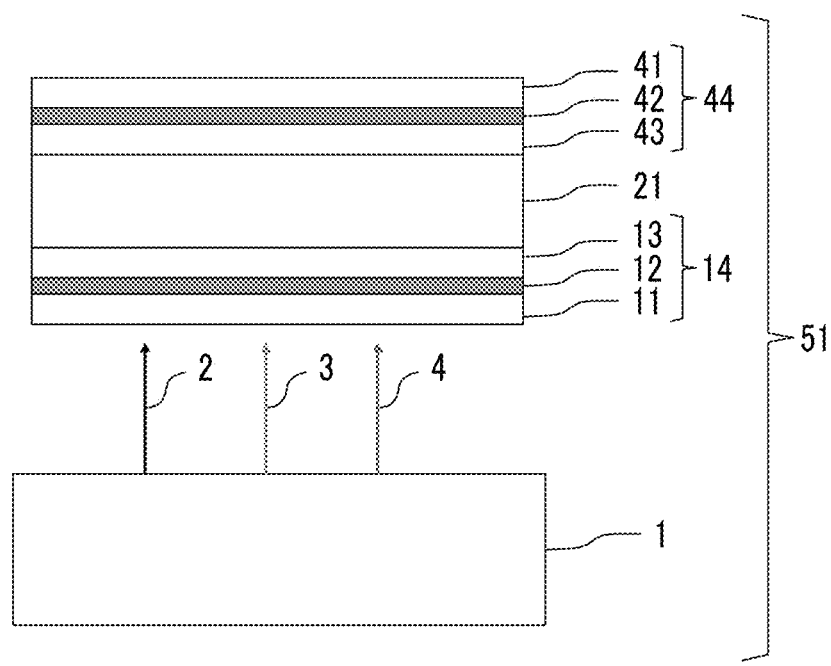
FIG. 4 is a diagram showing an example of a liquid crystal display device.

FIG. 4 shows an example of a liquid crystal display device according to an aspect of the present invention. A liquid crystal display device 51 shown in FIG. 4 includes a backlight-side polarizing plate 14 on a backlight side of a liquid crystal cell 21. The backlight-side polarizing plate 14 may include or may not include a polarizing plate protective film 11 on a backlight-side surface of a backlight-side polarizer 12. However, it is preferable that the backlight-side polarizing plate 14 includes the polarizing plate protective film 11.

In the backlight-side polarizing plate 14, it is preferable that the polarizer 12 is interposed between two polarizing plate protective films 11 and 13.

In this specification, a polarizing plate protective film closer to the liquid crystal cell than the polarizer will be referred to "inner side polarizing plate protective film", and a polarizing plate protective film more distant from the liquid crystal cell than the polarizer will be referred to "outer side polarizing plate protective film". In an example shown in FIG. 4, the polarizing plate protective film 13 is the inner side polarizing plate protective film, and the polarizing plate protective film 11 is the outer side polarizing plate protective film.

The backlight-side polarizing plate may include a phase difference film as the inner side polarizing plate protective film on the liquid crystal cell side. As this phase difference film, for example, a well-known cellulose acylate film can be used.

The liquid crystal display device 51 includes a display-side polarizing plate 44 on a side of the liquid crystal cell 21 opposite to the backlight side. In the display-side polarizing plate 44, a polarizer 42 is interposed between two polarizing plate protective films 41 and 43. The polarizing plate protective film 43 is the inner side polarizing plate protective film, and the polarizing plate protective film 41 is the outer side polarizing plate protective film.

The backlight unit 1 including the liquid crystal display device 51 is as described above.

Regarding each of the liquid crystal cell, the polarizing plate, and the polarizing plate protective film which constitute the liquid crystal display device, a product prepared using a well-known method or a commercially available product can be used without any particular limitation. In addition, of course, a well-known interlayer such as an adhesive layer can be provided between respective layers.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples.

Example: No. 105

<Preparation of Substrate/Barrier Layer>

A barrier film was formed on a single surface of a polyethylene terephthalate film (PET film, manufactured by Toyobo Co., Ltd. trade name: COSMOSHINE (registered trade name) A4300, thickness: 50 μm) in the following procedure.

Trimethylolpropane triacrylate (TMPTA, manufactured by Daicel-Cytec Co., Ltd.) and a photopolymerization initiator (ESACURE KTO 46, manufactured by Lamberti S.p.A.) were prepared and were weighed such that a mass ratio thereof was 95:5. These components were dissolved in methyl ethyl ketone. As a result, a coating solution having a solid content concentration of 15% was obtained. This coating solution was applied to the above-described PET film using a roll-to-roll method with a die coater and was allowed to pass through a drying zone at 50° C. for 3 minutes Next, in a nitrogen atmosphere, the coating solution was irradiated with ultraviolet light (cumulative irradiation dose: about 600 mJ/cm$^2$) to be cured, and the PET film was wound. The thickness of an organic layer formed on the support was 1 μm.

Further, an inorganic layer formed of silicon oxide was formed on the organic layer. In order to form the inorganic layer, a sputtering device was used, Si was used as a target, argon was used as a discharge gas, and oxygen was used as a reaction gas. The thickness of the inorganic layer was 50 nm, and a barrier film (a) was obtained.

<Formation of Light Scattering Layer>
(Light Scattering Layer-Forming Composition)

Urethane acrylate UA-160TM (manufactured by Shin-Nakamura Chemical Co., Ltd.): 97 parts by mass Photopolymerization initiator IRGACURE (registered trade name) 819 (manufactured by BASF SE): 3 parts by mass Methyl ethyl ketone: 100 parts by mass Cyclohexanone: 5 parts by mass Scattering particles (P-2, TiO$_2$ particles having a diameter R of 0.3 μm and a refractive index $n_p$ of 2.70; trade name titanium oxide for a pigment, manufactured by Ishihara Sangyo Kaisha Ltd.): 20 parts by mass The light scattering layer-forming composition prepared as described above was applied to the inorganic layer surface of the barrier film (a) prepared as described above using a die coater, was irradiated with ultraviolet light and fixed using an air-cooled metal halide lamp (manufactured by Eye Graphics Co., Ltd.) of 160 W/cm$^2$ in a nitrogen atmosphere, and was wound. As a result, a roll film in which the light scattering layer was further laminated on the inorganic layer was prepared.

The thickness d of the light scattering layer was 1 μm.

In Table 1 below, the urethane acrylate UA-160TM is shown as UA.

Table 1 below shows the R/d value, and the difference $\Delta n = n_p - n_b$ between the refractive index $n_p$ of the scattering particles and the refractive index $n_b$ (corresponding to the refractive index of the binder in No. 105) of the constituent elements other than the scattering particles.

<Formation of Wavelength Conversion Layer>
(Wavelength Conversion Layer-Forming Composition)

Quantum dots A (maximum emission wavelength: 530 nm): 0.1 parts by mass

Quantum dots B (maximum emission wavelength: 630 nm): 0.01 parts by mass

Phenoxyethyl acrylate (monofunctional acrylate compound; AMP-10G, manufactured by Shin-Nakamura. Chemical Co., Ltd.): 80 parts by mass Trimethylolpropane triacrylate (manufactured by Daicel-Cytec Co., Ltd.): 20 parts by mass Photopolymerization initiator IRGACURE 819 (manufactured by BASF SE): 1 part by mass As the quantum dots A and B, nanocrystals having the following core-shell structure (InP/ZnS) were used.

Quantum dots A: INP530-10 (manufactured by NN-Labs LLC.): fluorescence full width at half maximum-65 nm Quantum dots B: INP620-10 (manufactured by NN-Labs LLC.): fluorescence full width at half maximum=70 nm The wavelength conversion layer-forming composition was applied to the light scattering layer, the barrier film (a) was laminated thereon, the wavelength conversion layer-forming composition interposed between the light scattering layer and the second barrier film was cured by applying an external stimulus thereto using ultraviolet light. As a result, a wavelength conversion member in which the wavelength conversion layer including the quantum dots is interposed between the two barrier layers is prepared. The thickness D of the wavelength conversion layer was 50 μm, and the illuminance during the curing was 2000 mJ/cm$^2$.

In Table 1 below, phenoxyethyl acrylate is shown as PEA, and trimethylolpropane triacrylate is shown as TMPTA.

Table 1 below shows a ratio of the thickness d of the light scattering layer to the thickness D of the wavelength conversion layer by percentage.

<Measurement of Diameter of Particles>

The wavelength conversion member was cut into a specimen having a thickness of 50 nm using a microtome, and a multiplied image (50000 times) of a cross-section thereof was obtained using a scanning electron microscope. The apparent average particle sizes of 20 scattering particles in the image were measured, and the average value was obtained as the diameter of the particles.

<Measurement of Thickness d of Light Scattering Layer>

The thickness of the light scattering layer is defined as the thickness ranging from a surface of an inorganic barrier layer to an upper end of a region where the binder and/or the scattering particles which form the light scattering layer are present.

The thickness d of the light scattering layer was obtained using a first measuring method or a second measuring method described below. The first measuring method was used preferentially over the second measuring method.

First Measuring Method

The wavelength conversion member was cut obliquely at an angle of 2° using a microtome, and then a cut cross-section of the obtained film was analyzed by TOF-SIMS. The thickness of the light scattering layer was calculated by mapping focusing on characteristic ions of the components included in the light scattering layer (magnification: 28 times).

In the measurement using TOF-SIMS, the following device was used.

Device: TRIFT II manufactured by Physical Electronics Inc. (PHI)

The specimen was observed over a length of 50 μm, and the average thickness was obtained as the thickness d of the light scattering layer.

Second Measuring Method

In a case where characteristic ions easily detected by TOF-SIMS were not present in the light scattering layer, mapping was performed on the wavelength conversion layer side. A side where the quantum dots were not present was determined as the light scattering layer, and the thickness of the light scattering layer was detected using the first measuring method.

The specimen was observed over a length of 50 μm, and the average thickness was obtained as the thickness d of the light scattering layer.

<Evaluation of Light Scattering Layer>

(Particle Shedding)

A surface of the prepared wavelength conversion member was rubbed with BEMCOT (manufactured by Asahi Kasei Corporation) using a rubbing tester, and a test was performed. The test was performed under conditions of moving distance (one way): 13 cm, rubbing speed: 13 cm/sec, load: 1000 g/cm$^2$, distal end portion contact area: 1 cm×1 cm, and rubbing times: 100 times. Scratches on the outermost surface were observed by visual inspection and were evaluated based on the following three grades.

The following evaluation was performed, and the results thereof are shown in Tables 1 and 2 below.

A: No scratches were observed on the surface of a sample

B: Small scratches were observed on the surface of a sample

C: Scratches were observed on the surface of a sample, and the shedding of light scattering particles were found when the surface of the sample was observed with a microscope <Evaluation of Wavelength Conversion Layer-Forming Composition>

(Stability)

The wavelength conversion layer-forming composition was evaluated by mixing and dissolving the respective components with each other to form a coating composition, applying the coating composition to form a wavelength conversion member, and evaluating the wavelength conversion member. After the formation of the coating composition, 80 ml of the composition was weighed using a 100 ml glass bottle, and was left to stand at 20° C. for 10 days. Next, whether or not precipitates were present, and dispersibility in a case where the composition was stirred using a magnetic stirrer were evaluated.

The following evaluation was performed, and the results thereof are shown in. Tables 1 and 2 below.

A: No precipitates and aggregates were found

B: Precipitates were found in the bottom of the glass bottle but were redispersed during the stirring using the magnetic stirrer.

C: Precipitates were found in the bottom of the glass bottle, and aggregates detected by naked eyes were present without being redispersed during the stirring using the magnetic stirrer.

<Evaluation of Wavelength Conversion Member>

(Peeling Resistance)

The prepared wavelength conversion member was put into a thermostatic chamber at 80° C. for 1 hour, was humidified in a room having a temperature of 25° C. and a humidity of 60% for 1 hour, and was punched using a punching machine with a 4×4 cm Thomson blade to obtain five samples.

Regarding the punched 4×4 cm wavelength conversion member samples, peeling conditions of each side were scored based on the following standards. In this case the total maximum point of the four sides of each sample was 4. The results are shown in Tables 1 and 2.

(Standards of Peeling Conditions of Each Side)

0.00: No peeling or cracking was found 0.25: A region where peeling or cracking occurred accounted for 25% or lower of the side 0.50: A region where peeling or cracking occurred accounted for higher than 25% and 50% or lower of the side 0.75: A region where peeling or cracking occurred accounted for higher than 50% and 75% or lower of the side 1.00: A region where peeling or cracking occurred accounted for higher than 75% of the side The scores of the five wavelength conversion member samples were added and evaluated as follows. The results are shown in Tables 1 and 2 below.

A: The total score of the four sides was 0.00 or higher and lower than 1.00

B: The total score of the four sides was 1.00 or higher and lower than 5.00

C: The total score of the four sides was 5.00 or higher and lower than 10.00

D: The total score of the four sides was 10.00 or higher and lower than 15.00

E: The total score of the four sides was 15.00 or higher and lower than 20.00

(Barrier Properties (Durability): Evaluation of Decrease in Brightness in Outer Peripheral Region)

The wavelength conversion members were punched using a punching machine with a 4 cm×4 cm Thomson blade, were placed on a commercially available blue light source (trade name: "OPSM-H150X142B", manufactured by OPTEX FA Co., Ltd.) in a room held at 25° C. and a relative humidity of 60%, and were continuously irradiated with blue light for 100 hours. During the irradiation, a cycle of continuously irradiating the wavelength conversion members for 10 hours and then leaving them to stand for 5 hours without irradiation was repeated.

Next, a commercially available table terminal (Kindle (registered trade name) Fire HDX 7, manufactured by Amazon Co., Ltd.) was disassembled to extract a backlight unit, each of the wavelength conversion members continuously irradiated with the blue light for 100 hours was placed on a light guide plate, and two prism sheets extracted from Kindle Fire HDX 7" were laminated on the wavelength conversion member such that directions of surface unevenness patterns thereof were perpendicular to each other. The backlight unit was turned on, and the brightness was measured using an imaging colorimeter & photometer (ProMetric, manufactured by Radiant Vision Systems LLC.) provided at a distance of 740 mm from a surface of the backlight unit. Based on the measurement result, in an outer peripheral region (a region ranging from four corners of the screen to inner positions at a distance of 1 cm from the four corners), the proportion of areas where the brightness was decreased by 15% or higher compared to the brightness measured at the center of the screen was obtained and was evaluated based on the following evaluation standards. The results are shown in Tables 1 and 2 below (Evaluation Standards)

A: The proportion of areas where the brightness was decreased by 15% or higher in the outer peripheral region was lower than 10%

B: The proportion of areas where the brightness was decreased by 15% or higher in the outer peripheral region was 10% or higher and lower than 25%

C: The proportion of areas where the brightness was decreased by 15% or higher in the outer peripheral region was 25% or higher and lower than 50%

D: The proportion of areas where the brightness was decreased by 15% or higher in the outer peripheral region was 50% or higher and lower than 75%

E: The proportion of areas where the brightness was decreased by 15% or higher in the outer peripheral region was 75% or higher <Preparation of Liquid Crystal Display Device>

A commercially available liquid crystal display device (THL42D2, manufactured by Panasonic Corporation) was disassembled, and the prepared wavelength conversion member was added to a light guide plate on a liquid crystal cell side. As a result, the backlight unit was changed to the following B narrow band backlight unit, and a liquid crystal display device was manufactured. The B narrow band backlight unit used included a blue light emitting diode (NICHIA B-LED: Blue, dominant wavelength: 465 nm, full width at half maximum: 20 nm) as a light source. The disposition of the prepared wavelength conversion member was performed such that the barrier film side including the light diffusion layer was the blue light miffing diode side, <Evaluation of Liquid Crystal Display Device>

(Brightness)

The front brightness of the liquid crystal display device was measured using a method described in paragraph "0180" of JP2009-93166A. The results were evaluated based on the following standards. The results are shown in Tables 1 and 2 below, A: The front brightness was higher than that of the liquid crystal display device according to Comparative Example 1 by 15% or higher B: The front brightness was higher than that of the liquid crystal display device according to Comparative Example 1 by 10% or higher and lower than 15%

C: The front brightness was higher than that of the liquid crystal display device according to Comparative Example 1 by 5% or higher and lower than 10%

D: The front brightness was equal to or lower than that of the liquid crystal display device according to Comparative Example 1

(Scattering Uniformity)

Regarding the scattering uniformity of the backlight of the liquid crystal display device, white light obtained by mixing blue light (when recognized by visual inspection) of an incident light source with yellow light emitted after wavelength conversion was evaluated based on the following five grades. The results are shown in Tables 1 and 2 below.

A: The uniformity was high, and blue light and yellow light were not recognized from the emitted light B: The non-uniformity of blue light and yellow light was able to be slightly detected from the emitted light but was tolerable C: The non-uniformity of blue light and yellow light was able to be detected from the emitted light D: Significant color unevenness of blue light and yellow light was detected from the emitted light AA: The uniformity was higher than that of Sample NO. 108

[Examples and Comparative Examples: No. 101 to 104, 106 to 140, 201 to 220] Respective wavelength conversion members and liquid crystal display devices were prepared using the same method as that of No. 105, except that the materials and thicknesses of the inorganic barrier layer, the light scattering layer, and the wavelength conversion layer were changed as shown in Table 1 or 2 below.

In addition to the materials used for No. 105, the following materials were used as the materials of the light scattering layer and the wavelength conversion layer.

Scattering particles P-1: diameter R=0.3 μm, refractive index $n_p$=1.63, amino resin particles formed of melamine and benzoguanamine, the average particle size was adjusted during the preparation of amino resin particles 5 described in JP2008-146021A Scattering particles P-3: diameter R=0.3 μm, refractive index $n_p$=1.67, resin fine particles including zirconia nanoparticles, the particle size was adjusted during the preparation of translucent particles 1 described in JP2008-268934A Scattering particles P-4: diameter R=1.5 μm, refractive index $n_p$=1.63, amino resin particles formed of melamine and benzoguanamine, the average particle size was adjusted during the preparation of amino resin particles 5 described in JP2008-146021A Scattering particles P-5: diameter R=2.0 μm, refractive index $n_p$=1.49, polymethyl methacrylate (PMMA) particles, manufactured by Sekisui Plastics Co., Ltd.

Scattering particles P-6: diameter R=1.5 μm, refractive index $n_p$=1.67, resin fine particles including zirconia nanoparticles, the particle size was adjusted during the preparation of translucent particles 1 described in JP2008-268934A Scattering particles P-7: diameter R=0.4 μm, refractive index $n_p$=1.63, fluorene derivative polyester resin, trade name: OKP, manufactured by Osaka Gas Chemicals Co., Ltd.

Scattering particles P-11: diameter R=0.3 μm, refractive index $n_p$=1.43, $SiO_2$ particles, trade name: KE-P30, manufactured by Nippon Shokubai Co., Ltd.

Scattering particles P-12: diameter R=1.0 μm, refractive index $n_p$=1.43, $SiO_2$ particles, trade name: KE-P100, manufactured by Nippon Shokubai Co., Ltd.

Scattering particles P-13: diameter R=0.7 μm, refractive index $n_p$=1.43, fluororesin fine particles prepared by emulsion polymerization of fluorine-containing polymer P-1 described in JP2005-97402A Scattering particles P-14: diameter R=0.7 μm, refractive index $n_p$=1.42, silicone particles, trade name: XC99A8808, manufactured by Momentive Performance Materials Inc.

Scattering particles P-15: diameter R=2.0 μm, refractive index $n_p$=1.58, acryl/styrene copolymer particles, manufactured by Sekisui Plastics Co., Ltd.

$SiO_2$ fine particles of the light scattering layer: $SiO_2$ particles having a diameter of about 5 nm, trade name: MEK-ST, manufactured by Nissan Industries Ltd.

$ZrO_2$ fine particles of the light scattering layer: $ZrO_2$ particles having a diameter of about 5 nm, manufactured by Sumimoto Osaka Cement Co., Ltd.

PET30: OH-containing polyfunctional acrylate, trade name: KAYARAD PET-30 (mixture of pentaerythritol triacrylate/pentaerythritol tetraacrylate), manufactured by Nippon Kayaku Co., Ltd.

M350: trimethylolpropane EO-modified triacrylate, trade name: M-350, manufactured by Toagosei Co., Ltd.

Si-Cp: sol solution a described in paragraph "0156" of JP2006-18233A, methyl ethyl ketone (MEK) solution having a solid content of 40 mass %

PM21: phosphate resin as caprolactone EO-modified dimethacrylate phosphate, trade name: KAYAMER PM21, manufactured by Nippon Kayaku Co., Ltd.

CEL2021P: alicyclic epoxy resin, trade name: CELLOXIDE 2021P, manufactured by Daicel Corporation CYCLOMER M100: 3,4-epoxycyclohexylmethyl methacrylate, manufactured by Daicel Corporation

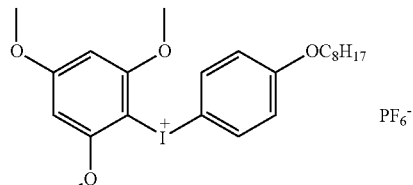

Photocationic Polymerization Initiator
(Iodonium Salt Compound) A

Constituent Elements (Binder+Fine Particles) of Light Scattering Layer Other than Scattering Particles A mass ratio between non-volatile components excluding a volatile solvent and a refractive index after curing will be shown using parentheses.

<<Preferable Aspect 1 shown in Table 1>>

CIA: (refractive index: 1.52)

TMPTA: (refractive index: 1.52)

*1) UA+$SiO_2$: mixed at a ratio of 80 parts by mass: 20 parts by mass (refractive index: 1.49)

*2): the constituent elements other than the scattering particles were not added to the light scattering layer

*3) PEA/TMPTA: mixed at a ratio of 10 parts by mass: 90 parts by mass (refractive index: 1.53)

*4) UA/M100: mixed at a ratio of 80 parts by mass: 20 parts by mass (refractive index: 1.52)

*5) PET30/M350: mixed at a ratio of 80 parts by mass: 20 parts by mass (refractive index: 1.52)

*6) UA/Si-Cp: mixed at a ratio of 90 parts by mass: 10 parts by mass (refractive index: 1.52)

*7) TMPTA/PM21: mixed at a ratio of 95 parts by mass: 5 parts by mass (refractive index: 1.52)

<<(Preferable Aspect 2 shown in Table 2>>

*11) UA/PM21+$ZrO_2$: mixed at a ratio of 57 parts by mass: 3 parts by mass: 40 parts by mass (refractive index: 1.58)

*12) UA/$ZrO_2$: mixed at a ratio of 60 parts by mass: 40 parts by mass (refractive index: 1.58)

*13) UA/CYCLOMER M100+$ZrO_2$: mixed at a ratio of 50 parts by mass: 10 parts by mass: 40 parts by mass (refractive index: 1.58)

*14) PET30+$ZrO_2$: mixed at a ratio of 60 parts by mass: 40 parts by mass (refractive index: 1.58)

*15) PET30/M350+$ZrO_2$: mixed at a ratio of 55 parts by mass: 5 parts by mass: 40 parts by mass (refractive index: 1.58)

*16) UA/silane coupling agent derivative Si-Cp+$ZrO_2$: mixed at a ratio of 55 parts by mass: 5 parts by mass: 40 parts by mass (refractive index: 1.58)

*17) TMPTA/PM21+$ZrO_2$: mixed at a ratio of 57 parts by mass: 3 parts by mass: 40 parts by mass (refractive index: 1.58)

*18) TMPTA/$ZrO_2$: mixed at a ratio of 60 parts by mass: 40 parts by mass (refractive index: 1.58)

Constituent Element of Binder of Wavelength Conversion Layer

<<Preferable Aspect 1 shown in Table 1 and Preferable Aspect 2 shown in Table 2>>

*1) PEA/TMPTA: mixed at a ratio of 80 parts by mass: 20 parts by mass (refractive index: 1.52)

*2) PEA/TMPTA/UA: mixed at a ratio of 80 parts by mass: 20 parts by mass: 2 parts by mass (refractive index: 1.52)

*3) Cationically polymerizable composition 1: CEL2021P/CYCLOMER M100/PEA/photocationic polymerization initiator A/IRGACURE 819, mixed at a ratio of 50:10:40:1:1 (refractive index: 1.52)

In each of the wavelength conversion members according to No. 102 and No. 103, the amount of the scattering particles P-1 added to the wavelength conversion layer was the same as the amount of the scattering particles P-1 included in the light scattering layer according to No. 107.

In each of the wavelength conversion members according to No. 202 and No. 203, the amount of the scattering particles P-11 added to the wavelength conversion layer was the same as the amount of the scattering particles P-11 included in the light scattering layer according to No. 205.

In No. 137 and No. 138, the inorganic barrier layer was formed using the following method.

During the preparation of the substrate/the barrier layer according to No. 105, a silicon nitride film having a thickness of 50 nm which was formed using a CVD method was used instead of the inorganic layer formed of silicon oxide.

In No. 114, the same light scattering layer as that of No. 113 was provided on a side of the barrier film opposite to the inorganic barrier layer of the substrate (opposite to the wavelength conversion layer).

No. 139 was prepared as follows. During the preparation of the wavelength conversion member according to No. 105, the composition of the light scattering layer was not changed, and a barrier film in which the light scattering layer was laminated on the inorganic layer having a thickness of 0.5 μm which was half of the thickness of the light scattering layer was obtained. A wavelength conversion member according to No. 139 was prepared using the same method as that of No. 105, except that this barrier film was used as upper and lower barrier films.

No. 140 was prepared as follows. During the preparation of the wavelength conversion member according to No. 106, the composition of the light scattering layer was not changed, and a barrier film in which the light scattering layer was laminated on the inorganic layer having a thickness of 0.5 μm which was half of the thickness of the light scattering layer was obtained. A wavelength conversion member according to No. 140 was prepared using the same method as that of No. 106, except that this barrier film was used as upper and lower barrier films.

No. 220 was prepared as follows. During the preparation of the wavelength conversion member according to No. 205, the composition of the light scattering layer was not changed, and a barrier film in which the light scattering layer was laminated on the inorganic layer having a thickness of 0.5 μm which was half of the thickness of the light scattering layer was obtained. A wavelength conversion member according to No. 220 was prepared using the same method as that of No. 205, except that this barrier film was used as upper and lower barrier films.

Table 1 shows the aspect of the design A of the refractive index of the light scattering layer, and Table 2 shows the aspect of the design B of the refractive index of the light scattering layer.

TABLE 1

| | | Light Scattering Layer | | | | | | | | Wavelength Conversion Layer | | |
|---|---|---|---|---|---|---|---|---|---|---|---|---|
| | | Scattering Particles | | | Constituent Elements Other than Scattering Particles (Binder + Fine Particles) | Thickness d (μm) | Thickness Ratio $R_2/d$ of Second Scattering Particles | Thickness Ratio $R/d$ of First Scattering Particles | Difference in Refractive Index | Binder | Thickness D (μm) | Particles Included |
| No. | Note | Kind | Diameter R (μm) | Amount | | | | | | | | |
| 101 | Comparative Example | — | — | — | — | — | — | — | — | *1) | 50 | — |
| 102 | Comparative Example | — | — | — | — | — | — | — | — | *1) | 50 | P-1 |
| 103 | Comparative Example | — | — | — | — | — | — | — | — | *2) | 52 | P-1 |
| 104 | Comparative Example | — | — | — | UA | 1 | — | — | — | *1) | 50 | — |
| 105 | Example | P-2 | 0.3 | 20 | UA | 1 | — | 0.3 | 1.18 | *1) | 50 | — |
| 106 | Example | P-3 | 0.3 | 20 | UA | 1 | — | 0.3 | 0.15 | *1) | 50 | — |
| 107 | Example | P-1 | 0.3 | 20 | UA | 1 | — | 0.3 | 0.11 | *1) | 50 | — |
| 108 | Example | P-1 | 0.3 | 20 | *1) | 1 | — | 0.3 | 0.14 | *1) | 50 | — |
| 109 | Example | P-1/P-4 | 0.3/1.5 | 17/3 | *1) | 1 | 1.5 | 0.3 | 0.14/0.14 | *1) | 50 | — |
| 110 | Example | P-1/P-4/P-5 | 0.3/1.5/2.0 | 15/3/2 | *1) | 1 | 2/1.5 | 0.3 | 0.14/0.14/0 | *1) | 50 | — |
| 111 | Example | P-3 | 0.3 | 20 | *1) | 1 | — | 0.3 | 0.15 | *1) | 50 | — |
| 112 | Example | P-3/P-6 | 0.3/1.5 | 17/3 | *1) | 1 | 1.5 | 0.3 | 0.15/0.15 | *1) | 50 | — |
| 113 | Example | P-3/P-6/P-5 | 0.3/1.5/2 | 15/3/2 | *1) | 1 | 2/1.5 | 0.3 | 0.15/0.15/0 | *1) | 50 | — |
| 114 | Comparative Example | The Same Light Scattering Layer as That of No. 113 was provided on Substrate Side of Barrier Film | | | | | | | | *1) | 50 | — |
| 115 | Comparative Example | P-1 | 0.3 | 20 | — *2) | 0.2 | — | — | — | *1) | 50 | — |
| 116 | Comparative Example | P-1 | 0.3 | 20 | TMPTA | 1 | — | 0.3 | 0.11 | *1) | 50 | — |
| 117 | Comparative Example | P-1 | 0.3 | 20 | UA | 6.5 | — | 0.04 | 0.11 | *1) | 50 | — |
| 118 | Comparative Example | P-1 | 0.3 | 20 | *3) | 1 | — | 0.3 | 0.10 | *1) | 50 | — |
| 119 | Comparative Example | P-2 | 0.3 | 20 | UA | 0.07 | — | 4.3 | 1.18 | *1) | 50 | — |
| 120 | Example | P-2 | 0.3 | 20 | UA | 0.2 | — | 1.5 | 1.18 | *1) | 50 | — |
| 121 | Example | P-2 | 0.3 | 20 | UA | 0.5 | — | 0.6 | 1.18 | *1) | 50 | — |
| 122 | Example | P-2 | 0.3 | 20 | UA | 1 | — | 0.3 | 1.18 | *1) | 50 | — |
| 123 | Example | P-2 | 0.3 | 20 | UA | 2 | — | 0.15 | 1.18 | *1) | 50 | — |
| 124 | Example | P-7 | 0.4 | 10 | UA | 1 | — | 0.4 | 1.11 | *1) | 50 | — |
| 125 | Example | P-7 | 0.4 | 20 | UA | 1 | — | 0.4 | 0.11 | *1) | 50 | — |
| 126 | Example | P-7 | 0.4 | 40 | UA | 1 | — | 0.4 | 0.11 | *1) | 50 | — |
| 127 | Example | P-1 | 0.3 | 20 | *1) | 1 | — | 0.3 | 0.14 | *3) | 50 | — |
| 128 | Example | P-1/P-4 | 0.3/1.5 | 17/3 | *1) | 1 | 1.5 | 0.3 | 0.14/0.14 | *3) | 50 | — |
| 129 | Example | P-1/P-4/P-5 | 0.3/1.5/2.0 | 15/3/2 | *1) | 1 | 2/1.5 | 0.3 | 0.14/0.14/0 | *3) | 50 | — |
| 130 | Example | P-3/P-6/P-5 | 0.3/1.5/2 | 15/3/2 | *1) | 1 | 2/1.5 | 0.3 | 0.15/0.15/0 | *3) | 50 | — |
| 131 | Example | P-7 | 0.4 | 20 | UA | 1.1 | — | 0.36 | 0.11 | *1) | 50 | — |
| 132 | Example | P-7 | 0.4 | 20 | *4) | 1.1 | — | 0.36 | 0.11 | *1) | 50 | — |
| 133 | Example | P-7 | 0.4 | 20 | PET30 | 1.1 | — | 0.36 | 0.11 | *1) | 50 | — |
| 134 | Example | P-7 | 0.4 | 20 | *5) | 1.1 | — | 0.36 | 0.11 | *1) | 50 | — |
| 135 | Example | P-7 | 0.4 | 20 | *6) | 1.1 | — | 0.36 | 0.11 | *1) | 50 | — |
| 136 | Example | P-7 | 0.4 | 20 | *7) | 1.1 | — | 0.36 | 0.11 | *1) | 50 | — |
| 137 | Example | P-1/P-4/P-5 | 0.3/1.5/2.0 | 15/3/2 | *1) | 1 | 2/1.5 | 0.3 | 0.14/0.14/0 | *1) | 50 | — |
| 138 | Example | P-3/P-6/P-5 | 0.3/1.5/2 | 15/3/2 | *1) | 1 | 2/1.5 | 0.3 | 0.15/0.15/0 | *1) | 50 | — |
| 139 | Example | P-2 | 0.3 | 20 | UA | 0.5 | — | 0.6 | 1.18 | *1) | 50 | — |
| 140 | Example | P-3 | 0.3 | 20 | UA | 0.5 | — | 0.6 | 0.15 | *1) | 55 | — |

TABLE 1-continued

| | | Evaluation | | | | | |
|---|---|---|---|---|---|---|---|
| | Thickness | Light Scattering Layer | Wavelength Conversion Layer-Forming | Wavelength Conversion Member | | Liquid Crystal Display Device | |
| No. | Ratio 100% × d/D | Particle Shedding | Composition Stability | Peeling Resistance | Barrier Properties (Durability) | Brightness | Scattering Uniformity |
| 101 | — | A | A | E | D | D | D |
| 102 | — | A | C | E | D | C | C |
| 103 | — | A | C | D | D | C | C |
| 104 | 2 | A | A | A | A | D | D |
| 105 | 2 | A | A | B | B | B | A |
| 106 | 2 | A | A | A | A | B | B |
| 107 | 2 | A | A | A | B | B | B |
| 108 | 2 | A | A | A | B | A | A |
| 109 | 2 | A | A | A | B | A | AA |
| 110 | 2 | A | A | A | B | A | AA |
| 111 | 2 | A | A | A | A | A | A |
| 112 | 2 | A | A | A | A | A | AA |
| 113 | 2 | A | A | A | A | A | AA |
| 114 | — | C | A | E | D | B | B |
| 115 | 0.4 | A | A | E | E | C | C |
| 116 | 2 | A | A | E | D | B | B |
| 117 | 13 | A | A | A | C | B | B |
| 118 | 2 | A | A | E | D | B | B |
| 119 | 0.14 | A | A | D | D | B | B |
| 120 | 0.4 | A | A | A | A | B | B |
| 121 | 1 | A | A | A | A | B | B |
| 122 | 2 | A | A | A | A | B | B |
| 123 | 4 | A | A | A | B | B | B |
| 124 | 2 | A | A | A | A | B | B |
| 125 | 2 | A | A | A | A | A | A |
| 126 | 2 | A | A | B | B | A | A |
| 127 | 2 | A | A | A | A | A | A |
| 128 | 2 | A | A | A | A | A | AA |
| 129 | 2 | A | A | A | A | A | AA |
| 130 | 2 | A | A | A | A | A | AA |
| 131 | 2.2 | A | A | A | A | B | B |
| 132 | 2.2 | A | A | A | A | B | B |
| 133 | 2.2 | A | A | A | A | B | B |
| 134 | 2.2 | A | A | A | A | B | B |
| 135 | 2.2 | A | A | A | A | B | B |
| 136 | 2.2 | A | A | A | A | B | B |
| 137 | 2 | A | A | A | A | A | AA |
| 138 | 2 | A | A | A | A | A | AA |
| 139 | 1 | A | A | A | B | A | AA |
| 140 | 1 | A | A | A | A | A | B |

TABLE 2

| | | Light Scattering Layer | | | | | | | Wavelength Conversion Layer | | |
|---|---|---|---|---|---|---|---|---|---|---|---|
| | | Scattering Particles | | | Constituent Elements Other than Scattering Particles (Binder + Fine Particles) | Thickness d (μm) | Thickness Ratio $R_2$/d of Second Scattering Particles | Thickness Ratio R/d of First Scattering Particles | Difference in Refractive index | | |
| No. | Note | Kind | Diameter R (μm) | Amount | | | | | | Binder | Thickness D (μm) | Particles Included |
| 201 | Comparative Example | — | — | — | — | — | — | — | — | *1) | 50 | — |
| 202 | Comparative Example | — | — | — | — | — | — | — | — | *1) | 50 | P-11 |
| 203 | Comparative Example | — | — | — | — | — | — | — | — | *2) | 52 | P-11 |
| 204 | Comparative Example | — | — | — | *11) | 1.0 | — | — | — | *1) | 50 | — |
| 205 | Example | P-11 | 0.3 | 18 | *11) | 1.0 | — | 0.3 | 0.15 | *1) | 50 | — |
| 206 | Example | P-11/P-12 | 0.3/1.0 | 18/3 | *11) | 1.0 | — | 0.3/1.0 | 0.15/0.15 | *1) | 50 | — |

TABLE 2-continued

| | | | | | | | | | | | | |
|---|---|---|---|---|---|---|---|---|---|---|---|---|
| 207 | Example | P-11/P-12/P-15 | 0.3/1.0/2.0 | 18/3/2 | *11) | 1.0 | 2.0 | 0.3/1.0 | 0.15/0.15/0 | *1) | 50 | — |
| 208 | Example | P-13 | 0.7 | 20 | *11) | 1.0 | — | 0.7 | 0.15 | *1) | 50 | — |
| 209 | Example | P-14 | 0.7 | 20 | *11) | 1.0 | — | 0.7 | 0.16 | *1) | 50 | — |
| 210 | Example | p-11 | 0.3 | 20 | *12) | 1.2 | — | 0.25 | 0.15 | *1) | 50 | — |
| 211 | Example | p-11 | 0.3 | 20 | *13) | 1.2 | — | 0.25 | 0.15 | *1) | 50 | — |
| 212 | Example | p-11 | 0.3 | 20 | *14) | 1.2 | — | 0.25 | 0.15 | *1) | 50 | — |
| 213 | Example | p-11 | 0.3 | 20 | *15) | 1.2 | — | 0.25 | 0.15 | *1) | 50 | — |
| 214 | Example | p-11 | 0.3 | 20 | *16) | 1.2 | — | 0.25 | 0.15 | *1) | 50 | — |
| 215 | Example | p-11 | 0.3 | 20 | *17) | 1.2 | — | 0.25 | 0.15 | *1) | 50 | — |
| 216 | Comparative Example | p-11 | 0.3 | 20 | *18) | 1.2 | — | 0.25 | 0.15 | *1) | 50 | — |
| 217 | Example | p-11 | 0.3 | 18 | *11) | 1.0 | — | 0.3 | 0.15 | *3) | 50 | — |
| 218 | Example | P-11/P-12 | 0.3/1.0 | 18/3 | *11) | 1.0 | — | 0.3/1.0 | 0.15/0.15 | *3) | 50 | — |
| 219 | Example | P-11/P-12/P-15 | 0.3/1.0/2.0 | 18/3/2 | *11) | 1.0 | 2.0 | 0.3/1.0 | 0.15/0.15/0 | *3) | 50 | — |
| 220 | Example | P-11 | 0.3 | 18 | *11) | 0.5 | — | 0.6 | 0.15 | *1) | 50 | — |

| | | Evaluation | | | | |
|---|---|---|---|---|---|---|
| | | Wavelength Conversion | Wavelength Conversion Member | | Liquid Crystal Display Device | |
| | Thickness | Layer-Forming | | Barrier | | |
| No. | Ratio 100% × d/D | Composition Stability | Peeling Resistance | Properties (Durabilty) | Brightness | Scattering Uniformity |
| 201 | — | A | E | D | D | D |
| 202 | — | C | E | D | C | C |
| 203 | — | C | D | D | C | C |
| 204 | 2 | A | A | A | D | D |
| 205 | 2 | A | A | A | A | B |
| 206 | 2 | A | A | A | A | AA |
| 207 | 2 | A | A | A | A | A |
| 208 | 2 | A | A | A | A | B |
| 209 | 2 | A | A | A | A | B |
| 210 | 2.4 | A | A | A | B | B |
| 211 | 2.4 | A | A | A | B | B |
| 212 | 2.4 | A | A | A | B | B |
| 213 | 2.4 | A | A | A | B | B |
| 214 | 2.4 | A | A | A | B | B |
| 215 | 2.4 | A | A | A | B | B |
| 216 | 2.4 | A | E | D | B | B |
| 217 | 2 | A | A | A | A | B |
| 218 | 2 | A | A | A | A | A |
| 219 | 2 | A | A | A | A | AA |
| 220 | 1 | A | A | A | A | A |

[Evaluation Results]

It was found from tables that, in the wavelength conversion member according to the present invention, the stability of a wavelength conversion layer-forming composition including quantum dots, the peeling resistance between a barrier layer and a wavelength conversion layer, the durability of barrier properties of the wavelength conversion layer, and the brightness and scattering uniformity of an image display device into which the wavelength conversion member is incorporated are excellent. It was found that, in the barrier film according to each of the Examples, the oxygen permeability was 0.01 cm³/(m²·day·atm) or lower.

It was found from No. 101 and No. 201 that, in a case where the scattering particles are not included in any layer, the peeling resistance between the barrier layer and the wavelength conversion layer, the durability of barrier properties of the wavelength conversion layer, and the brightness and scattering uniformity of an image display device into which the wavelength conversion member is incorporated are poor.

It was found from a comparison between No. 102 and No. 107 and a comparison between No. 202 and No. 205 that, in a case where the scattering particles are included in the wavelength conversion layer but are not included in the light scattering layer, the stability of the wavelength conversion layer-forming composition including the quantum dots, the peeling resistance between the barrier layer and the wavelength conversion layer, the durability of barrier properties of the wavelength conversion layer, and the brightness and scattering uniformity of an image display device into which the wavelength conversion member is incorporated are poor.

It was found from No. 103 and No. 203 that, in a case where the wavelength conversion layer includes the scattering particles and the binder which is formed of the compound (curable urethane) having a hydrogen bonding functional group and a polymerizable group in a molecule but the light scattering layer is not provided, the stability of the wavelength conversion layer-forming composition including the quantum dots, the peeling resistance between the barrier layer and the wavelength conversion layer, the durability of barrier properties of the wavelength conversion layer, and the brightness and scattering uniformity of an image display device into which the wavelength conversion member is incorporated are poor.

It was found from No. 104 and No. 204 that, even in a case where an undercoat layer including no scattering particles is provided between the inorganic barrier layer and the wavelength conversion layer, the brightness and scattering uniformity of an image display device into which the wavelength conversion member is incorporated are poor.

It was found from No. 114 that, in a case where the light scattering layer is provided on the substrate side of the barrier film but the light scattering layer is not provided between the inorganic barrier layer and the wavelength conversion layer, the peeling resistance between the barrier layer and the wavelength conversion layer, and the durability of barrier properties of the wavelength conversion layer are poor.

It was found from No. 115 that, in a case where the light scattering layer includes no binder, the peeling resistance between the barrier layer and the wavelength conversion layer, the durability of barrier properties of the wavelength conversion layer, and the brightness and scattering uniformity of an image display device into which the wavelength conversion member is incorporated are poor.

It was found from No. 116 and No. 118 that, in a case where a binder which is outside of the range of the present invention is used as the binder of the light scattering layer, the peeling resistance between the barrier layer and the wavelength conversion layer, and the durability of barrier properties of the wavelength conversion layer are poor.

It was found from No. 117 that, in a case where a light scattering layer in which the thickness of the light scattering layer and the ratio of the thickness of the light scattering layer to the thickness of the wavelength conversion layer exceed the upper limit values defined in the present invention is used, the durability of barrier properties of the wavelength conversion layer is poor.

It was found from No. 119 that, in a case where a light scattering layer in which the thickness of the light scattering layer and the ratio of the thickness of the light Scattering layer to the thickness of the wavelength conversion layer fall below the lower limit values defined in the present invention is used, the peeling resistance between the barrier layer and the wavelength conversion layer, and the durability of barrier properties of the wavelength conversion layer are poor.

EXPLANATION OF REFERENCES

1: backlight unit
1A: light source
1B: light guide plate
100: manufacturing device
10: first film
20: coating portion
22: coating film
24: die coater
26: backup roller
28: cured layer
30: laminating portion
32: laminating roller
34: heating chamber
50: second film
60: curing portion
62: backup roller
64: ultraviolet irradiation device
70: laminated film
80: peeling roller
BL: a barrier layer
LSL: a light scattering layer
d: a thickness of the light scattering layer
WCL: a wavelength conversion layer
D: a thickness of the wavelength conversion layer
1st SP: first scattering particles
$R_1$: a diameter of the first scattering particles
2nd SP: second scattering particles
$R_2$: a diameter of the second scattering particles
FP: fine particles

What is claimed is:

1. A wavelength conversion member in which a wavelength conversion layer including quantum dots is interposed between two barrier layers, the wavelength conversion member comprising:
   a light scattering layer that is provided between at least one of the barrier layers and the wavelength conversion layer,
   wherein one of the barrier layers closest to the light scattering layer is formed of an inorganic component,
   the light scattering layer includes a binder, which is formed of at least either a compound having a hydrogen bonding functional group and a polymerizable group in a molecule or an organic metal coupling agent, and scattering particles having a diameter R of 0.2 to 5 μm,
   a thickness d of the light scattering layer is 0.2 to 2 μm,
   a thickness D of the wavelength conversion layer is 20 to 100 μm, and
   a ratio of the thickness d of the light scattering layer to the thickness D of the wavelength conversion layer is 0.2% to 10%.

2. The wavelength conversion member according to claim 1,
   wherein a refractive index $n_b$ of constituent elements of the light scattering layer other than the scattering particles and a refractive index $n_p$ of the scattering particles having the diameter R of 0.2 to 5 μm included in the light scattering layer satisfy the following Expression 1, $$0.04 \leq |n_p - n_b| \leq 1.35. \qquad \text{Expression 1}$$

3. The wavelength conversion member according to claim 1,
   wherein the refractive index $n_b$ of the constituent elements of the light scattering layer other than the scattering particles is 1.45 to 1.54,
   the refractive index $n_p$ of the scattering particles having the diameter R of 0.2 to 5 μm included in the light scattering layer is 1.55 and 2.80, and
   the following Expression A-1 is satisfied, $$0.04 \leq |n_p - n_b| \leq 1.35. \qquad \text{Expression A-1}$$

4. The wavelength conversion member according to claim 3,
   wherein the refractive index $n_b$ is 1.45 or higher and lower than 1.49, and
   the following Expression A-2 is satisfied, $$0.06 \leq |n_p - n_b| \leq 1.35. \qquad \text{Expression A-2}$$

5. The wavelength conversion member according to claim 4,
   wherein the light scattering layer includes at least the binder and fine particles having a diameter of 110 nm or less as the constituent elements other than the scattering particles, and
   a refractive index of the fine particles having a diameter of 110 nm or less is 1.48 or lower.

6. The wavelength conversion member according to claim 3, wherein the scattering particles having the diameter R of 0.2 to 5 µm are at least one kind of particles selected from the group consisting of inorganic oxide particles, particles which are formed of a monomer having a fluorene skeleton, and resin particles including inorganic oxide fine particles.

7. The wavelength conversion member according to claim 1,
wherein the refractive index $n_b$ of the constituent elements of the light scattering layer other than the scattering particles is 1.55 to 1.80,
the refractive index $n_p$ of the scattering particles having the diameter R of 0.2 to 5 µm included in the light scattering layer is 1.20 and 1.54, and
the following Expression B-1 is satisfied, $$0.04 \leq |n_p - n_b| \leq 0.60. \qquad \text{Expression B-1}$$

8. The wavelength conversion member according to claim 7,
wherein the light scattering layer includes at least the binder and fine particles having a diameter of 110 nm or less as the constituent elements other than the scattering particles, and
a refractive index of the fine particles having a diameter of 110 nm or less is 1.65 or higher.

9. The wavelength conversion member according to claim 7,
wherein as the binder included in the light scattering layer, a binder which is formed of a monomer having a fluorene skeleton is included.

10. The wavelength conversion member according to claim 7,
wherein the scattering particles having the diameter R of 0.2 to 5 µm are at least one kind of particles selected from the group consisting of inorganic particles, fluorine-containing compound particles, and silicone particles.

11. The wavelength conversion member according to claim 2,
wherein the light scattering layer includes first scattering particles and second scattering particles having a larger diameter than the first scattering particles,
a diameter of the first scattering particles is 0.2 to 1 µm,
a diameter of the second scattering particles is more than 1 µm and 5 µm or less, and
the second scattering particles satisfy the following Expression 2, $$|n_{p2} - n_b| < 0.04, \qquad \text{Expression 2}$$

in Expression 2, $n_{p2}$ represents a refractive index of the second scattering particles, and $n_b$ represents the refractive index of the constituent elements of the light scattering layer other than the scattering particles.

12. The wavelength conversion member according to claim 11,
wherein the following Expression 3 is satisfied, $$1.0 < R_2/d \leq 4 \qquad \text{Expression 3}$$

in Expression 3, $R_2$ represents a diameter of the second scattering particles in units of µm, and
d represents the thickness of the light scattering layer in units of µm.

13. The wavelength conversion member according to claim 1,
wherein the light scattering layer includes first scattering particles and second scattering particles having a larger diameter than the first scattering particles,
at least either the first scattering particles or the second scattering particles are the scattering particles having the diameter R of 0.2 to 5 µm,
the second scattering particles satisfy the following Expression 3, and
the first scattering particles satisfy the following Expression 4, $$1.0 < R_2/d \leq 4 \qquad \text{Expression 3}$$

$$0.05 \leq R_1/d \leq 1.0 \qquad \text{Expression 4}$$

in Expressions 3 and 4, $R_2$ represents the diameter of the second scattering particles in units of µm,
$R_1$ represents a diameter of the first scattering particles in units of µm, and
d represents the thickness of the light scattering layer in units of µm.

14. The wavelength conversion member according to claim 1,
wherein the wavelength conversion layer includes at least green light emitting quantum dots and red light emitting quantum dots.

15. The wavelength conversion member according to claim 1,
wherein the wavelength conversion layer includes a binder which is formed of
an alicyclic epoxy, or
a monofunctional (meth)acrylate compound in which a value Mw/F obtained by dividing a molecular weight Mw by the number F of polymerizable functional groups included in one molecule is 130 or higher, one (meth)acryloyl group is present in one molecule is 1, and a Log P value is 3.0 or lower.

16. A backlight unit comprising at least the wavelength conversion member according to claim 1 and a light source.

17. An image display device comprising at least the wavelength conversion member according to claim 1.

* * * * *